US012284780B2

(12) United States Patent
Anderson et al.

(10) Patent No.: US 12,284,780 B2
(45) Date of Patent: Apr. 22, 2025

(54) MANAGING CABLES IN FIBER INSTALLATION

(71) Applicant: CommScope Technologies LLC, Hickory, NC (US)

(72) Inventors: John Paul Anderson, Eden Prairie, MN (US); Jason Mikel Bautista, Mayer, MN (US); Paula Lockhart, New Prague, MN (US); Kamlesh G. Patel, Chanhassen, MN (US); Michael J. Wentworth, Belle Plaine, MN (US); William J. Young, Plano, TX (US); Scott C. Sievers, Jordan, MN (US)

(73) Assignee: CommScope Technologies LLC, Hickory, NC (US)

( * ) Notice: Subject to any disclaimer, the term of this patent is extended or adjusted under 35 U.S.C. 154(b) by 240 days.

(21) Appl. No.: 18/061,281

(22) Filed: Dec. 2, 2022

(65) Prior Publication Data

US 2023/0189468 A1 Jun. 15, 2023

Related U.S. Application Data

(63) Continuation of application No. PCT/US2021/035453, filed on Jun. 2, 2021.
(Continued)

(51) Int. Cl.
*H05K 7/14* (2006.01)
*G02B 6/38* (2006.01)
*G02B 6/44* (2006.01)

(52) U.S. Cl.
CPC ......... *H05K 7/1491* (2013.01); *G02B 6/3897* (2013.01); *G02B 6/4452* (2013.01); *G02B 6/4457* (2013.01); *G02B 6/4459* (2013.01)

(58) Field of Classification Search
CPC .. H05K 7/1491; G02B 6/3897; G02B 6/4452; G02B 6/4457; G02B 6/4459;
(Continued)

(56) References Cited

U.S. PATENT DOCUMENTS 7,463,812 B2 12/2008 Coburn et al.
7,899,299 B2 3/2011 Coburn et al.
(Continued)

FOREIGN PATENT DOCUMENTS

| EP | 2 795 385 B1 | 9/2018 |
| JP | 2004004862 A | 1/2004 |
| WO | 2019/204317 A1 | 10/2019 |

OTHER PUBLICATIONS

FiberGuide® Quick-Fit Adapter Kit, Square 4 in × 4 in vertical drop, CommScope, 2 pages (Revised Apr. 27, 2020).
(Continued)

*Primary Examiner* — John Bedtelyon
(74) *Attorney, Agent, or Firm* — MERCHANT & GOULD P.C.

(57) ABSTRACT

A server rack is cabled to obviate the need for top-of-rack switches. Switches and severs are connected through de-mateable connection interfaces at distribution modules disposed along the raceway above the server cabinets. The distribution modules may have externally accessible ports, internally accessible ports, and/or payout spools for the switch cables and/or the server cables.

38 Claims, 35 Drawing Sheets

Related U.S. Application Data

(60) Provisional application No. 63/033,636, filed on Jun. 2, 2020.

(58) Field of Classification Search
CPC ............ G02B 6/44524; G02B 6/44528; G02B 6/4453; G02B 6/444; H04Q 1/06
See application file for complete search history.

(56) References Cited

U.S. PATENT DOCUMENTS

| | | | |
|---|---|---|---|
| 8,070,112 | B2 | 12/2011 | Smrha et al. |
| 8,376,288 | B2 | 2/2013 | Smrha et al. |
| 8,655,137 | B2 | 2/2014 | Baldassano et al. |
| 8,750,670 | B2 | 6/2014 | Coburn et al. |
| 8,842,445 | B2 * | 9/2014 | Anderson .............. H05K 7/186 361/826 |
| 8,867,915 | B1 | 10/2014 | Vahdat et al. |
| 8,879,278 | B2 | 11/2014 | Keith |
| 9,632,274 | B2 | 4/2017 | Coburn et al. |
| 10,547,166 | B2 | 1/2020 | Wang et al. |
| 10,585,259 | B2 | 3/2020 | Coburn et al. |
| 2008/0017760 | A1 | 1/2008 | Larsen et al. |
| 2010/0322582 | A1 | 12/2010 | Cooke et al. |
| 2011/0100668 | A1 | 5/2011 | Syed |
| 2014/0341523 | A1 | 11/2014 | Waite et al. |

OTHER PUBLICATIONS

Universal Connectivity Platform (UCP) Xtra-U Aerial Panel Holder Kit for FGS, mixed media, 2RU, galvanized, CommScope, 2 pages (Revised Apr. 27, 2020).

International Search Report and Written Opinion for PCT/US2021/035453 mailed Sep. 17, 2021.

* cited by examiner

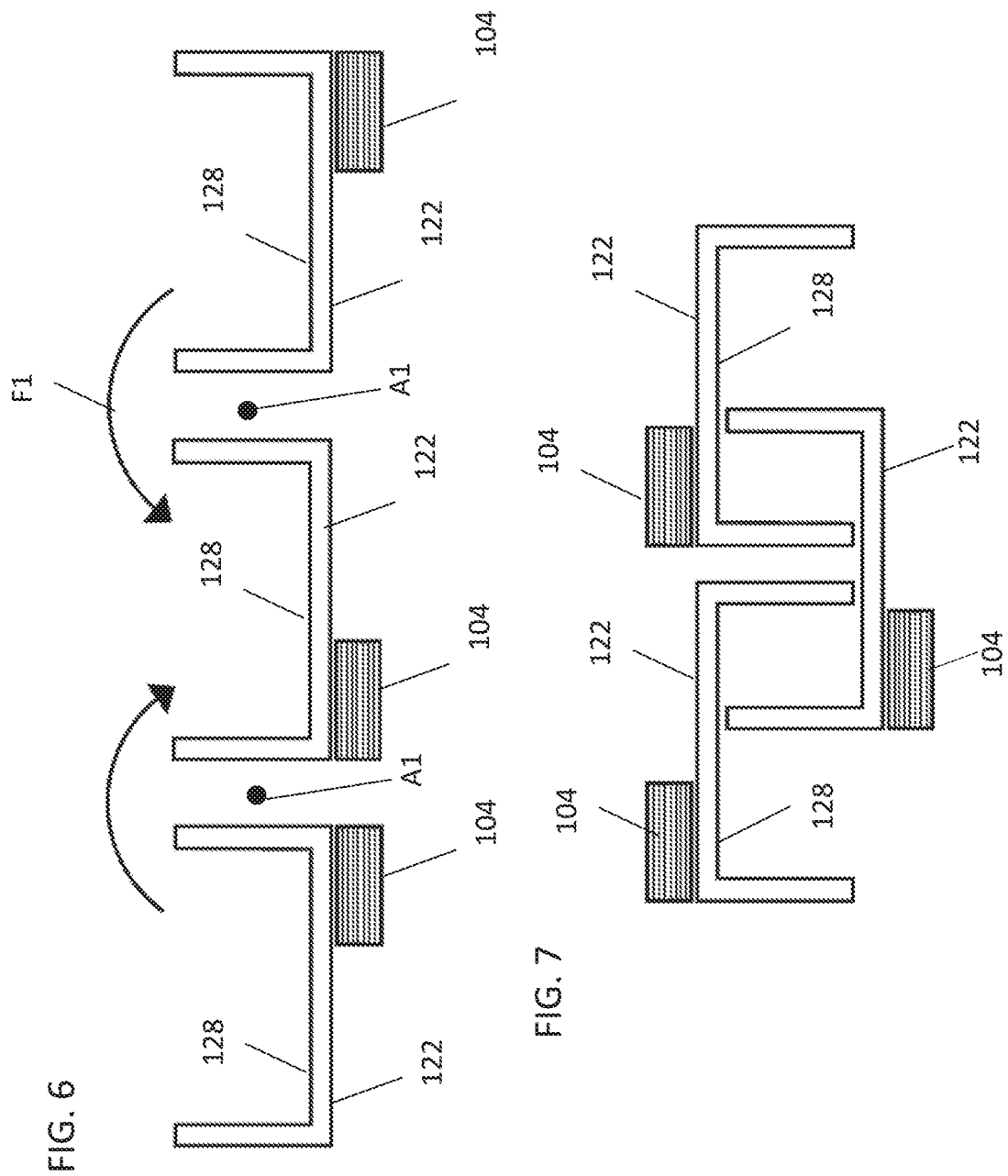

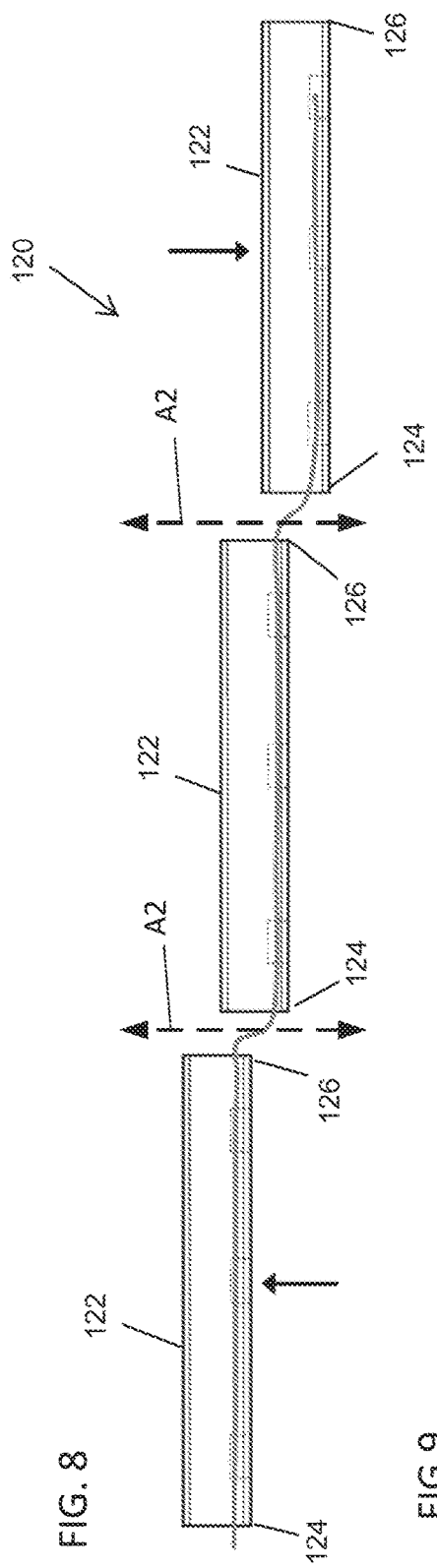
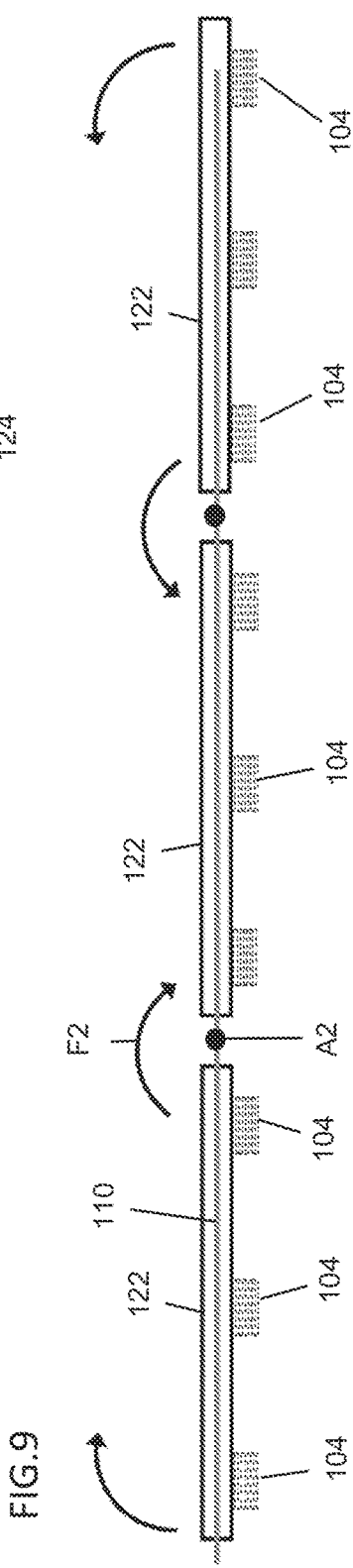
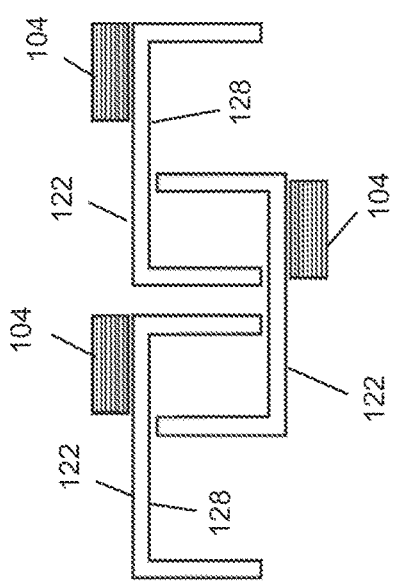
FIG. 8
FIG. 9
FIG. 10

MANAGING CABLES IN FIBER INSTALLATION

CROSS-REFERENCE TO RELATED APPLICATION

This application is a Continuation of PCT/US2021/035453, filed on Jun. 2, 2021, which claims the benefit of U.S. Patent Application Ser. No. 63/033,636, filed on Jun. 2, 2020, the disclosures of which are incorporated herein by reference in their entireties.

BACKGROUND

In data centers, data servers are mounted on rows of racks. Each rack holds multiple data servers. Typically, a rack switch is mounted to the top of each rack. Each data server in the rack is connected to the rack switch. For example, a data server includes two transceivers that each sends and receives optical signals. A rack switch includes multiple transceivers for sending and receiving optical signals. Each data server transceiver is connected to one of the transceivers of the rack switch. The rack switch is then connected to an optical network using one or more network switch (e.g., tier 1 switches). Improvements are desired.

SUMMARY

Some aspects of the disclosure are directed to a cabling system for optically coupling rack-mounted switches and servers. The cabling system includes one or more distribution modules mounted to a raceway installed over the rack. Optical signals are carried over first cables routed directly between the switches of a switch cabinet and the distribution modules without passing through an intervening switch or a de-mateable connection interface. At the distribution modules, the first cables are connected to second cables, which are routed directly from the distribution modules down to respective servers.

In certain implementations, the switches are disposed within a common switch cabinet and the distribution modules are disposed above server cabinets in the same rack as the switch cabinet. The server cabinets do not have top-of-rack switches.

In certain implementations, the first cables connect to the distribution modules at externally accessible ports carried by the first distribution modules. In some examples, the second cables connects to the first distribution modules at other externally accessible ports (e.g., downwardly facing ports, laterally facing ports, etc.) of the distribution modules. In such examples, the distribution modules have optical circuitry that connects the externally accessible ports and the other externally accessible ports. In other examples, first ends of the second cables are paid out from spools while second ends are optically coupled to the externally accessible ports (e.g., by being plugged into internally accessible ports).

In certain implementations, the first cables connects to the distribution modules at internally accessible ports within the distribution modules. In some examples, the second cables connect to the distribution modules are opposite internally accessible ports. In other examples, the second cables connect to the distribution module at externally accessible ports. In some examples, the internally accessible ports define horizontal fiber insertion axes. In other examples, the internally accessible ports define vertical fiber insertion axes.

In certain implementations, the distribution modules each include one or more spools from which the first cables and/or the second cables are paid out.

In certain implementations, multiple distribution modules are grouped in a distribution module arrangement at a common location along the raceway. In certain examples, the distribution modules of a distribution module arrangement are mounted to the raceway using a common bracket.

In certain implementations, the distribution modules are configured to store excess length of the second optical cables. In some examples, the distribution modules include storage sections at which excess length is stored. In other examples, corresponding storage modules can be mounted with the distribution modules to store the excess length. In other examples, the excess length can be stored on spools within the distribution modules.

Other aspects of the disclosure relate to a fiber raceway unit that can be used to form a fiber raceway for use in the cabling system. The fiber raceway unit includes two or more raceway troughs that each carry one or more distribution modules. The troughs are configured to be mounted together end-to-end. The troughs of the fiber raceway unit are tethered together by pre-cabling the distribution modules so that a bundle of first optical cables extends from the distribution modules to a common end of the unit.

In certain implementations, the fiber raceway unit is implemented using any of the distribution modules described herein.

In some implementations, one or more fiber raceway units form a primary raceway for the rack. In other implementations, one or more of the fiber raceway units form an auxiliary raceway mounted beneath the primary raceway.

Other aspects of the disclosure are directed to a method of installing a cabling system at a sever rack. The method includes routing first cables along a raceway between a switch cabinet and a plurality of distribution modules disposed at spaced locations along the raceway so that the first cables extend directly between the switch cabinet and the distribution modules; and routing second cables directly between the distribution modules and respective server cabinets.

In certain implementations, the first and second cables are routed directly to any of the distribution modules described herein.

A variety of additional inventive aspects will be set forth in the description that follows. The inventive aspects can relate to individual features and to combinations of features. It is to be understood that both the forgoing general description and the following detailed description are exemplary and explanatory only and are not restrictive of the broad inventive concepts upon which the embodiments disclosed herein are based.

BRIEF DESCRIPTION OF THE DRAWINGS

The accompanying drawings, which are incorporated in and constitute a part of the description, illustrate several aspects of the present disclosure. A brief description of the drawings is as follows:

FIGS. 4-7 illustrate a first example packing technique suitable for use in packing and shipping the fiber raceway arrangement of FIG. 3;

FIGS. 8-10 illustrate a second example packing technique suitable for use in packing and shipping the fiber raceway arrangement of FIG. 3;

DETAILED DESCRIPTION

Reference will now be made in detail to exemplary aspects of the present disclosure that are illustrated in the accompanying drawings. Wherever possible, the same reference numbers will be used throughout the drawings to refer to the same or like parts.

Figure 1:
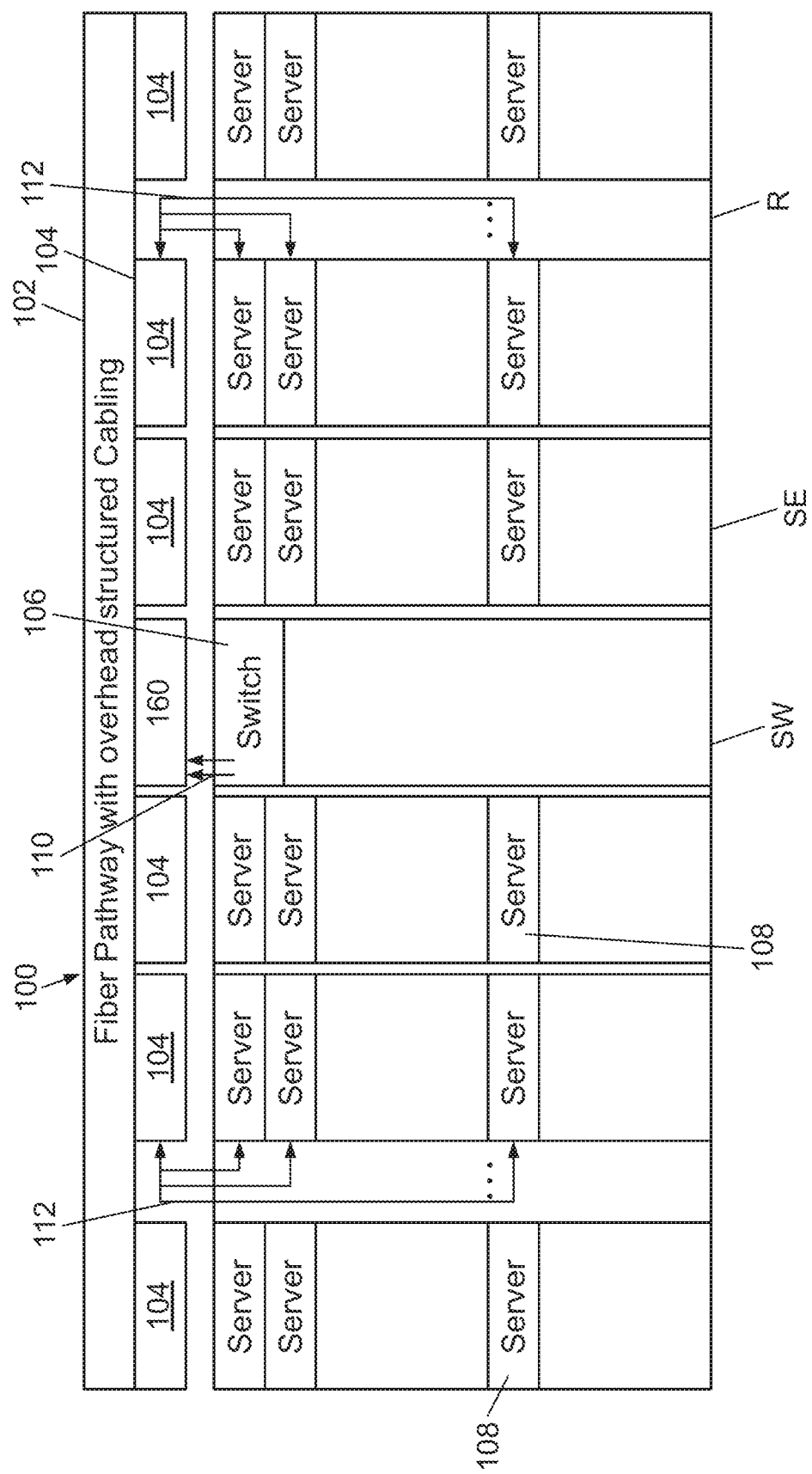
FIG. 1 is a schematic diagram showing an example telecommunications rack and a fiber raceway, the telecommunications rack including a switch cabinet servicing a plurality of server cabinets, the fiber raceway including a plurality of distribution modules disposed over the server cabinets.
Figure 2:
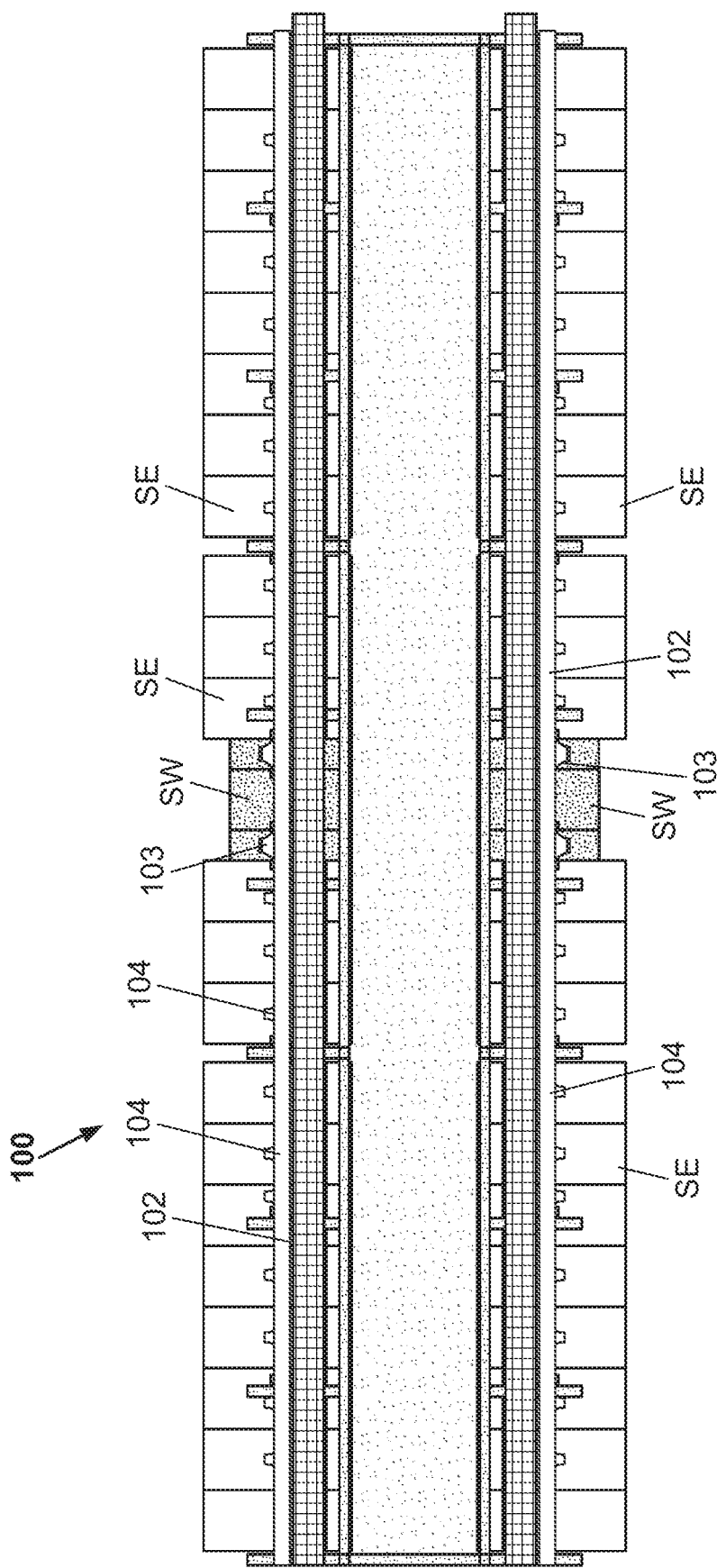
FIG. 2 shows the telecommunications rack and fiber raceway of FIG. 1 in a top plan view so that a second rack and second fiber raceway are visible extending parallel to the telecommunications rack and fiber raceway of FIG. 1.

Referring to FIGS. 1 and 2, the present disclosure is directed to a structured cabling system 100 for a data center. The structured cabling system 100 eliminates the need for a top of rack switch in each server cabinet SE. Rather, a single switch cabinet SW serves the needs of a plurality of server cabinets SE in a rack R. For example, switches 106 in a single switch cabinet SW may be optically coupled to servers 108 in surrounding server cabinets SE in the rack R. In certain implementations, as shown in FIG. 2, each rack R may include a first row of switch and server cabinets SW, SE facing in a first direction and a second row of switch and server cabinets SW, SE facing in a second direction First optical cables (also referred to as switch cables) 110 extend upwardly from the switch cabinet SW towards a fiber raceway 102 disposed above the rack R. Second optical cables (also referred to as server cables) 112 extend upwardly from the server cabinets SE towards the fiber raceway 102. The second optical cables 112 are optically coupled to the first optical cables 110 at distribution modules 104 mounted to the fiber raceway 102. Accordingly, the first and second cables cooperate to optically couple the switches 106 to the various servers 108. Various examples of distribution modules 104 suitable for use in the structured cabling system 100 are shown in FIGS. 11-44.

In some implementations, each distribution module 104 is disposed above one of the server cabinets SE. In other implementations, each distribution module 104 may serve multiple adjacent server cabinets SE. In some implementations, the fiber raceway 102 includes a transition guide 160 (e.g., a contoured ramp) to protect the first cables 110 as the first cables 110 transition onto the raceway 102. In such implementations, the fiber raceway 102 defines a channel 103 (e.g., see FIG. 15) along which to guide the first optical cables 110 along the raceway 102 towards the distribution modules 104. In other implementations, a distribution module also may be disposed over the switch cabinet SW with intermediate cables extending between the switch cabinet distribution module and 103 the various server cabinet distribution modules.

Figure 13:
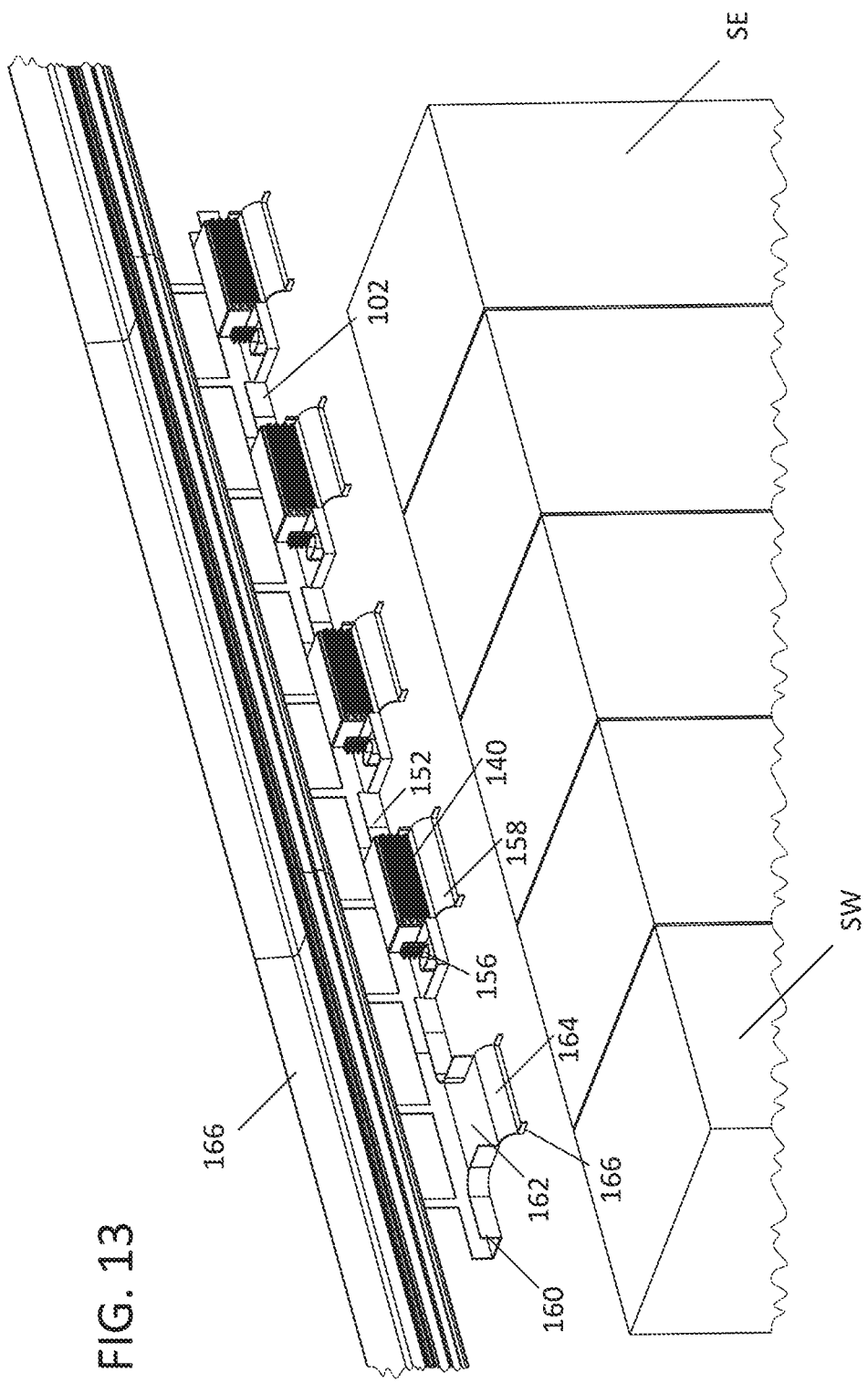
FIG. 13 illustrates the cabling system of FIG. 1 implemented using the first distribution module of FIG. 11 and the raceway of FIG. 12.

An example transition guide 160 for use in guiding the first optical cables 110 between the fiber raceway 102 and the switch cabinet SW is shown in FIG. 13. The transition component 160 includes a lateral extension 162 that extends perpendicular to a fiber routing direction defined by the raceway 102. The lateral extension 162 may include sidewalls to facilitate retaining the first optical cables 110. A contoured ramp 164 curves downwardly from the lateral extension 162. The ramp 164 is sufficiently contoured to provide bend radius protection to the first optical cables 110 between the raceway 102 and the vertical drop to the switch cabinet SW. Retention fingers 166 may be disposed on the contoured ramp 164 to aid in retaining the first optical cables 110 on the contoured ramp 164.

The raceway 102 is mounted to an overhead structure above the rack R. In some implementations, the raceway 102 is mounted to a ladder rack or a wire basket. In other implementations, the raceway 102 is an auxiliary rack mounted below another fiber raceway 166 (e.g., see FIG. 13). In some such examples, the raceway 102 may service only a subset of the cabinets SW, SE on the rack R. In certain examples, the raceway 166 may define apertures through which cables may transition between the raceway 166 and the auxiliary raceway 102.

FIGS. 3-10 an example fiber raceway arrangement 120 that can be used to facilitate installation of the fiber raceway 102 and distribution modules 104. The fiber raceway arrangement 120 includes two or more fiber raceway troughs 122 carrying distribution modules 104. The troughs 122 and distribution modules 104 are pre-cabled so that the troughs 122 are tethered together by one or more cables 130 even when the troughs 122 are detached from each other. In certain examples, multiple cables 130 are routed to each distribution module 104. In certain examples, the cables 130 include the first cables 110 routed from the switch cabinet SW.

Figure 3:
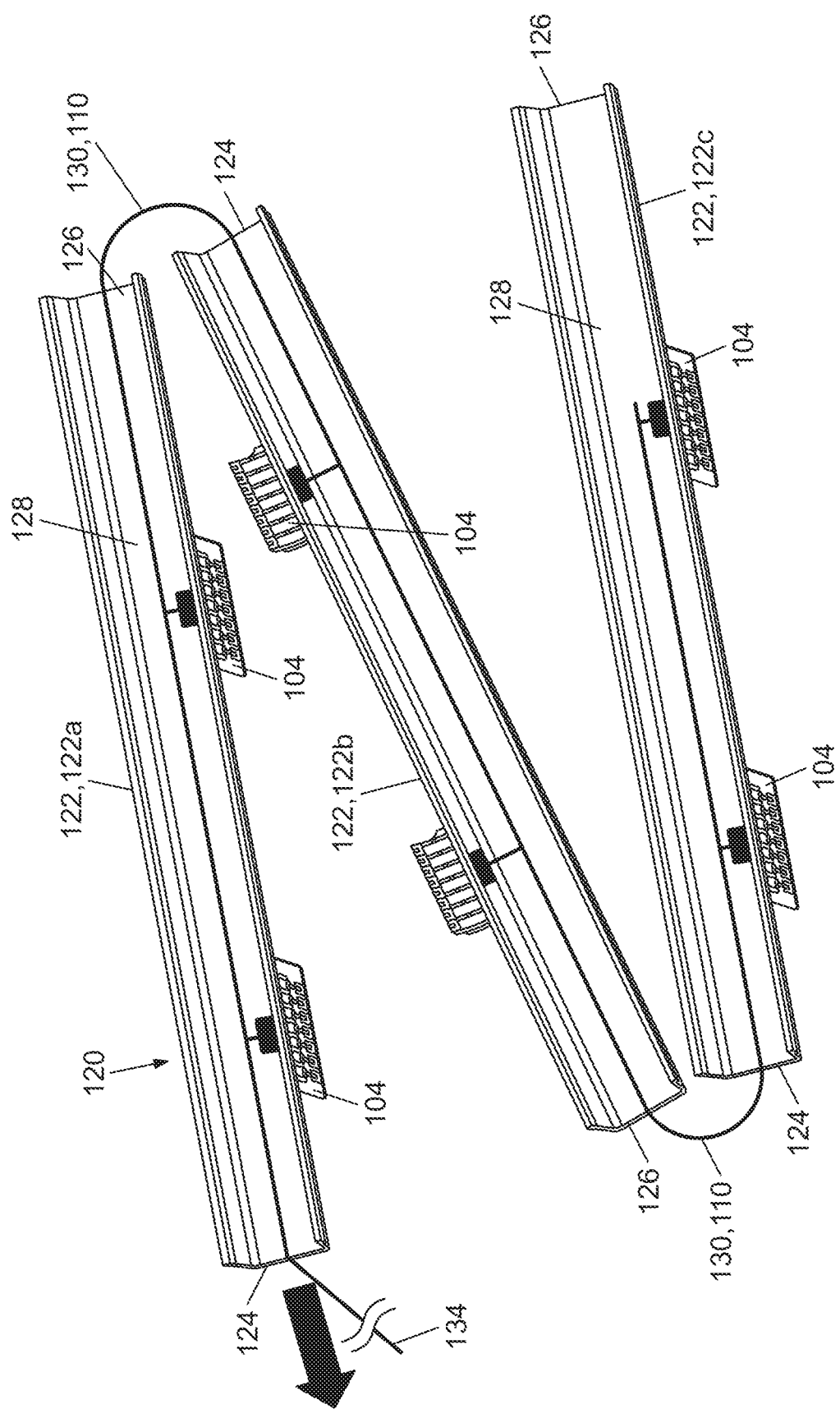
FIG. 3 is a schematic view of an example fiber raceway arrangement suitable for use as part of the fiber raceways of FIGS. 1 and 2, the fiber raceway arrangement including a plurality of troughs tethered together by pre-cabled distribution modules disposed along the troughs.

In the example shown in FIG. 3, the fiber raceway arrangement 120 includes three troughs 122a, 122b, 122c. In other examples, the fiber raceway arrangement 120 can include a greater or lesser number of troughs 122. Each trough 122, 122a, 122b, 122c is elongate between a first end 124a-124c and an opposite second end 126a-126c. The troughs 122 couple together (e.g., end-to-end) to define a continuous channel 128. In some examples, the second end 126 of one trough 122 mounts directly to the first end 124 of another trough 122. In other examples, a joining member may be disposed between the ends 124, 126 to mount two troughs 122 together.

In certain implementations, one or more distribution modules 104 are mounted to each trough 122. In some examples, each trough 122 has a common number of distribution modules 104. In other examples, the troughs 122 of a fiber raceway arrangement 120 may have different numbers of distribution modules 104. First ends 132 of the cables 130 are attached (e.g., plugged into, anchored to, wound around spools within, etc.) to the distribution modules 104. Second ends 134 of the cables 130 are routed towards a common end (e.g., first end 124a of the first trough 122a) of the fiber raceway arrangement 120. In certain examples, the cables 130 are sufficiently long that the second ends 134 of the cables extend beyond the common end of the fiber raceway arrangement 120. Accordingly, the second ends 134 can be routed from the fiber raceway arrangement 120 to the switch cabinet SW.

In some implementations, each switch cabinet SW includes cables routed to two fiber raceway arrangements 120—one fiber raceway arrangement 120 extending towards the server cabinets SE at one side of the switch cabinet SW and another fiber raceway arrangement 120 extends towards the server cabinets SE at an opposite side of the switch cabinet SW. In other implementations, only one fiber raceway arrangement 120 is provided for each switch cabinet SW. In still other implementations, two or more fiber raceway arrangements 120 can be mounted end-to-end to form an extended fiber raceway arrangement to service one or more switch cabinets SW.

Figure 4:
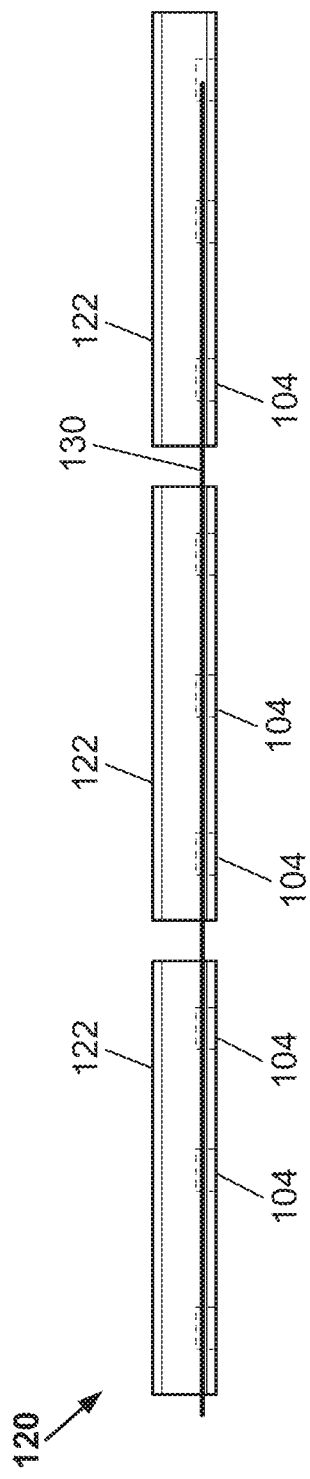
Figure 5:
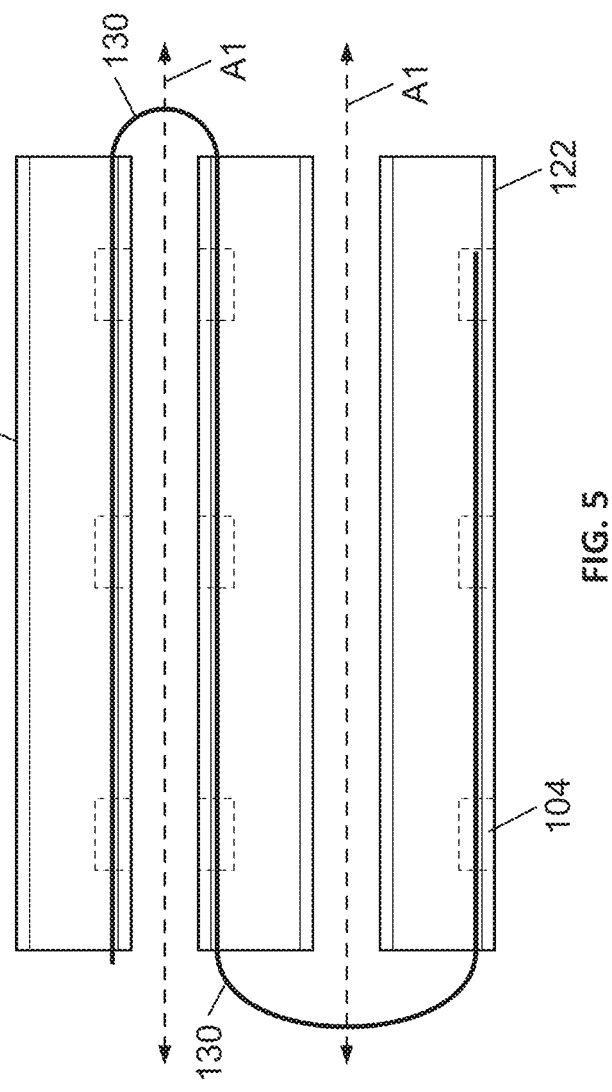

FIGS. 4-7 illustrate one example packaging technique for shipping a fiber raceway arrangement 120. As depicted in FIGS. 4-5, the troughs 122 of the fiber raceway arrangement 120 are laid parallel to each other while tethered. Accordingly, adjacent troughs are oriented in opposite directions (the first end 124 of one trough 122 faces in the same direction as the second end 126 of an adjacent trough 122). The outer troughs 122 are then flipped (e.g., see arrow F1) over longitudinal axes A1 so that the middle trough 122 is extending upwardly into the channels 128 defined by the outer troughs 122. This technique results in a compact unit for shipping and initial installation at the data center.

FIGS. 8-10 illustrate another example packaging technique for a fiber raceway arrangement 120. As shown in FIG. 8, the troughs 122 are laid generally in a line, but with adjacent troughs 122 being laterally offset from each other. Accordingly, the first ends 124 of the troughs face in a common direction and the second ends 126 of the troughs 122 face in another direction. The outer troughs 122 are then flipped (e.g., see arrow F2) towards the middle trough 122 over lateral axes A2, resulting in about the same compact unit for shipping as depicted in FIG. 7.

Referring to FIGS. 11-44, a plurality of distribution modules 104 are mounted at spaced positions along the raceway 102. Each distribution module 104 includes a body 114 carrying an input 116 and an output 118. The input 116 is configured to optically couple to or include the first optical cables 110. The output 118 is configured to optically couple to or include the second optical cables 112. Optical circuitry carried with the body 114 optically couples together the input 116 and the output 118. The body 114 is configured so that the input 116 faces in a different direction from the output 118. In some examples, the input 116 faces in a direction that is perpendicular to a direction in which the output 118 faces. In other examples, the input 116 faces in an opposite direction from the output 118.

In some implementations, the input 116 includes one or more de-mateable optical connection interfaces. In some examples, the input 116 includes one or more multi-fiber de-mateable optical connection interfaces. In other example, the input 116 includes one or more single-fiber de-mateable optical connection interfaces. In some implementations, each de-mateable optical connection interface includes an optical adapter defining one or more externally accessible ports configured to receive a plug connector (e.g., an MPO connector, an SN plug connector, a duplex LC plug connector, etc.).

In other examples, each de-mateable optical connection interface may include one or more connectorized ends of one or more stub cables configured to extend outwardly from the body 114 of the distribution module 104. In an example, each stub cable is anchored to the body 114 and extends outwardly from the body 114. In another example, each stub cable is wound around a spool carried by the body 114 and selectively paid out from the spool and away from the body 114. In other implementations, the input 116 may include one or more unconnectorized ends of the one or more stub cables (e.g., for optical splicing to the first cables 110).

In certain implementations, the output 118 includes one or more de-mateable optical connection interfaces. In some example, the output 118 includes one or more multi-fiber de-mateable optical connection interfaces. In other example, the output 118 includes one or more single-fiber de-mateable optical connection interfaces. In some implementations, each de-mateable optical connection interface includes an optical adapter defining one or more externally accessible ports configured to receive one or more plug connectors (e.g., LC plug connectors, SC connectors, SN connectors, duplex LC plug connectors, MPO connectors, etc.).

In other examples, each de-mateable optical connection interface may include a connectorized end of a stub cable extending outwardly from the body 114. In an example, the stub cable is anchored to the body 114 and extends outwardly from the body 114. In another example, the stub cable is wound around a spool carried by the body 114 and selectively paid out from the spool and away from the body 114. In other implementations, the output 118 may include one or more unconnectorized ends of the one or more stub cables (e.g., for optical splicing to the second cables 112).

In certain implementations, the de-mateable optical connection interfaces of the input 116 are different from the de-mateable optical connection interfaces of the output 118. For example, the input 116 may include fewer de-mateable optical connection interfaces each having a larger fiber count compared to the output 118. In some examples, the input 116 includes multi-fiber de-mateable optical connection interfaces and the output 118 includes single-fiber de-mateable optical connection interfaces. In other examples, the input 116 include a larger fiber count (e.g., twelve fiber, sixteen fiber, twenty-four fiber, etc.) multi-fiber de-mateable optical connection interfaces and the output 118 includes a smaller fiber count (e.g., two fiber, four fiber, etc.) multi-fiber de-mateable optical connection interfaces.

In some implementations, each distribution module 104 is mounted above a respective server cabinet SE (e.g., see FIG. 13). In other implementations, a plurality of distribution modules 104 are mounted together in a distribution module arrangement with each distribution module arrangement being mounted above a respective server cabinet (e.g., see distribution module arrangements 220, 320, 370, 430, and 490 of FIGS. 19, 27, 32, 38, and 43).

Figure 16:
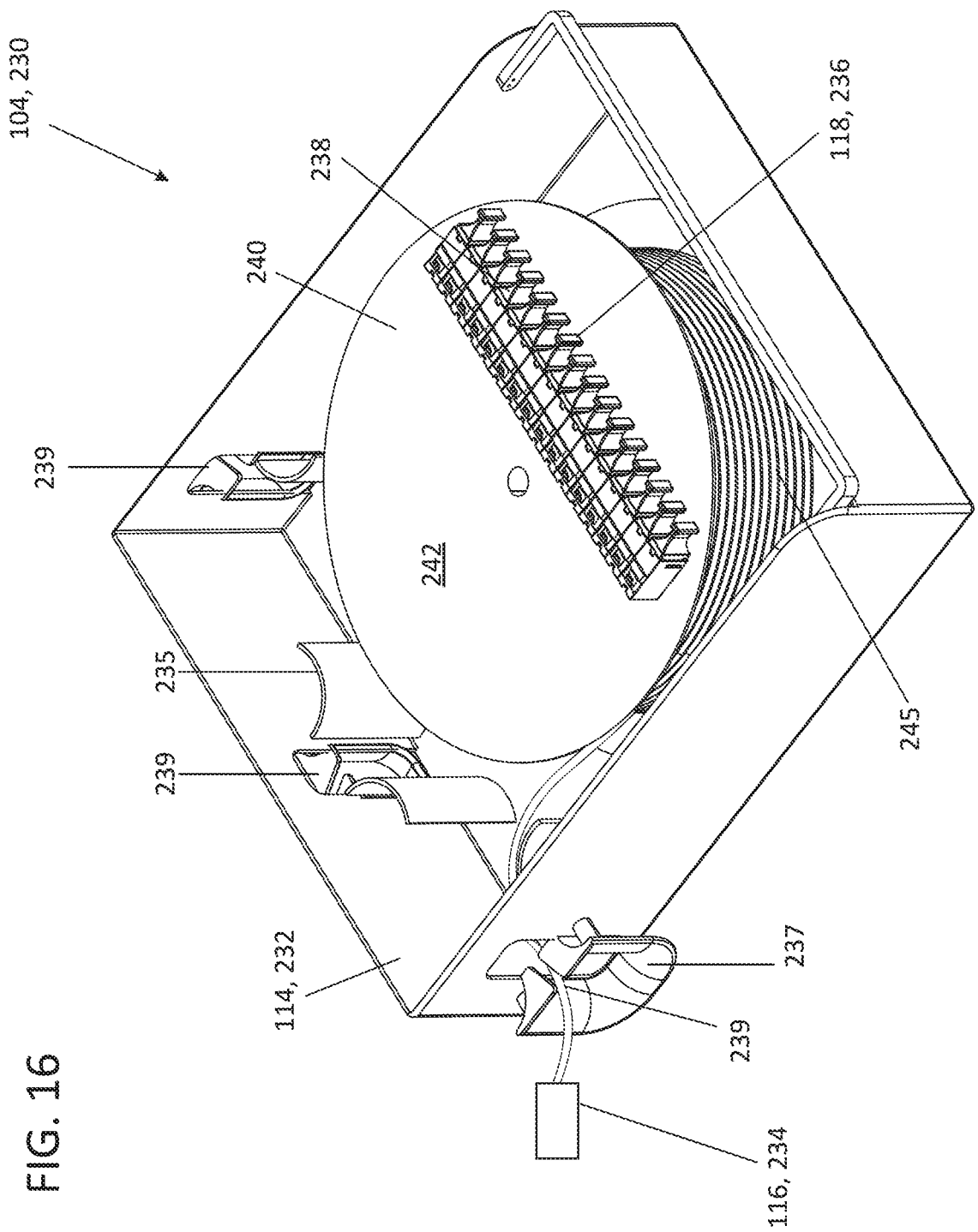
FIG. 16 is a front perspective view of a third example distribution module suitable for use in the cabling system of FIGS. 1-10.
Figure 24:
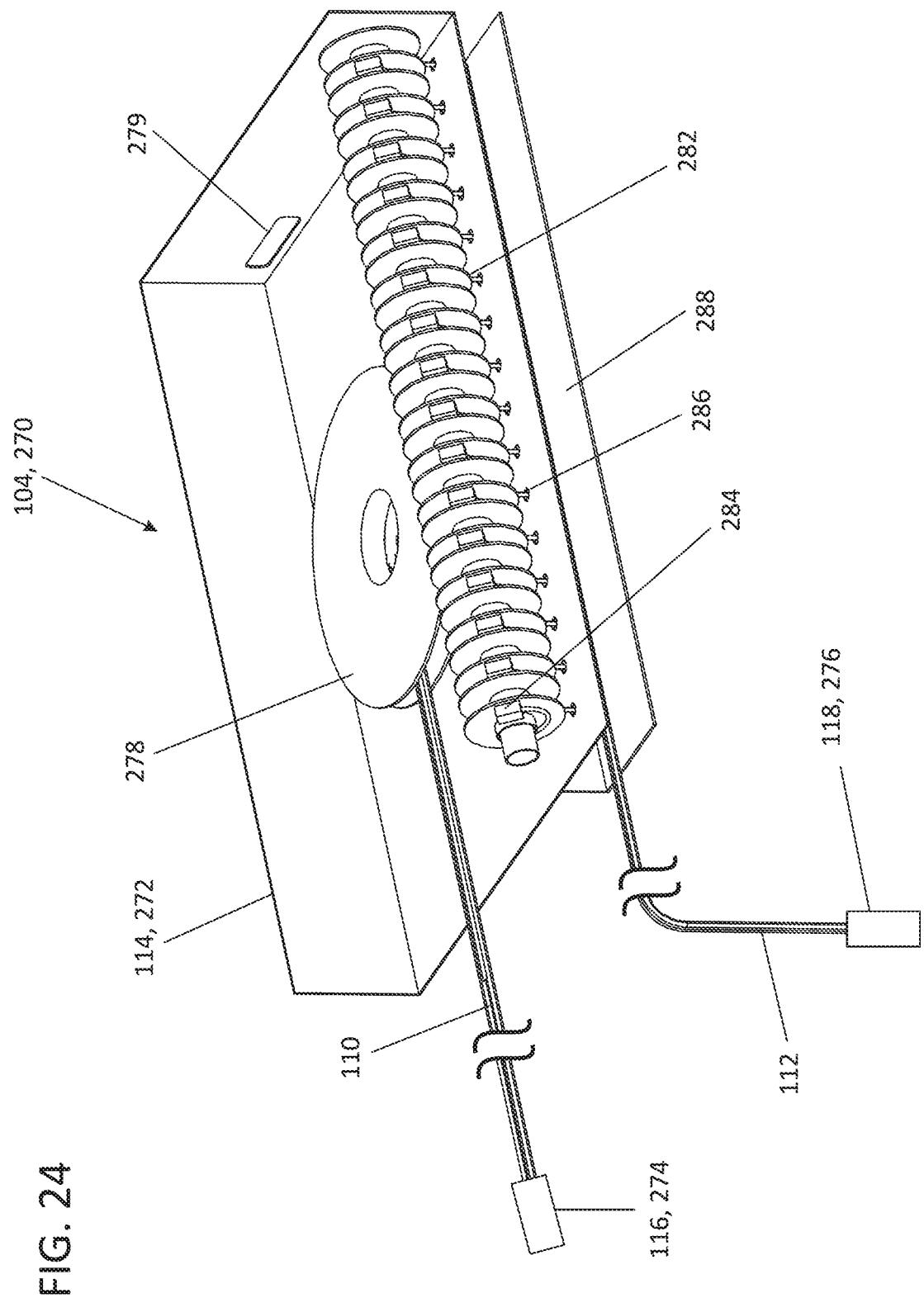
FIG. 24 is a front perspective view of a sixth example distribution module suitable for use in the cabling system of FIGS. 1-10.
Figure 25:
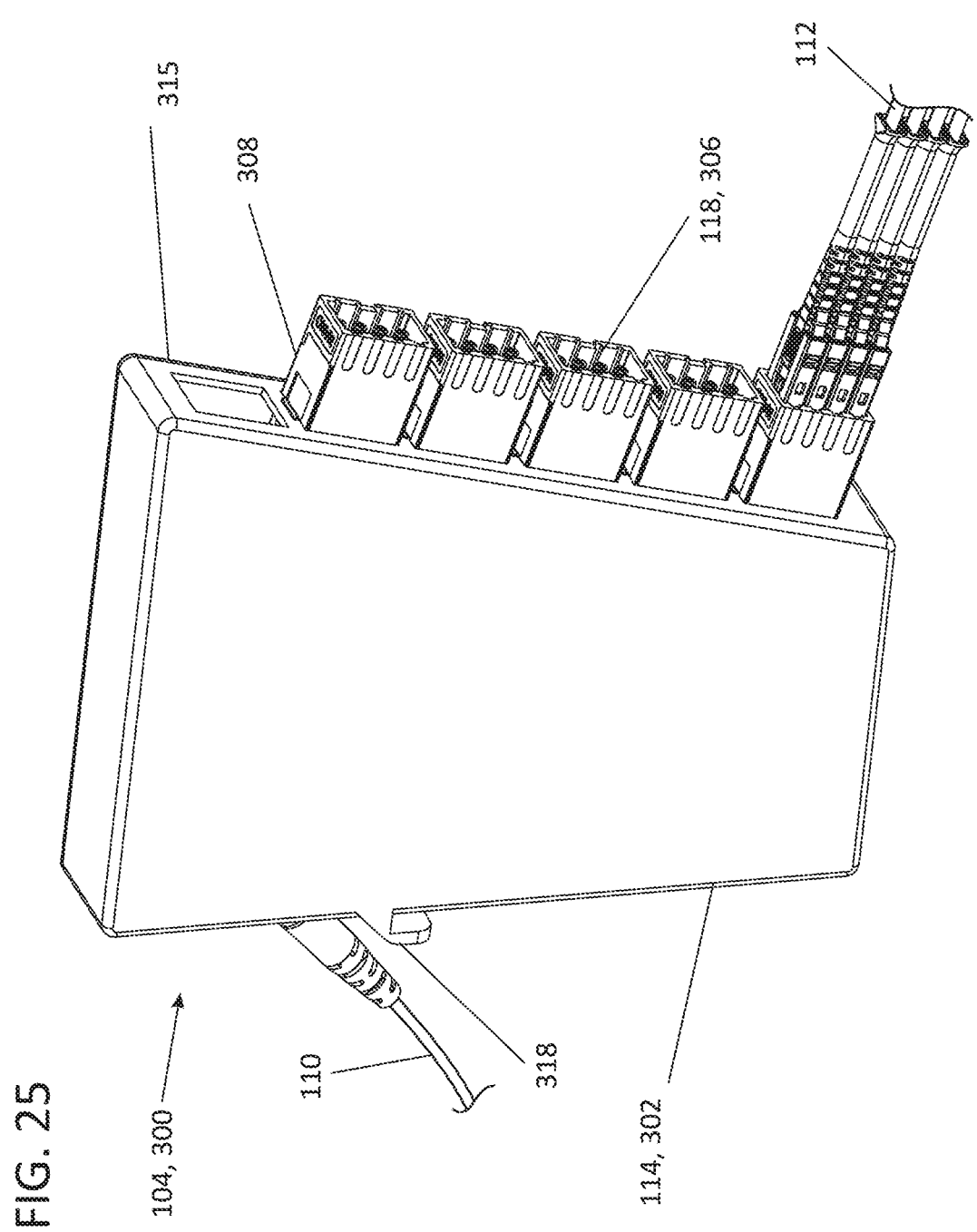
FIG. 25 is a front perspective view of a seventh example distribution module suitable for use in the cabling system of FIGS. 1-10.

In certain implementations, the first optical cables 110 are paid out from spools at the distribution modules 104 (e.g., see distribution modules 230, 270 of FIGS. 16 and 24). In certain implementations, the first optical cables 110 are routed to externally accessible ports of the distribution modules 104 (e.g., see distribution modules 140, 170, 200, and 250 of FIGS. 11, 14, 18, and 22). In certain implementations, the first optical cables 110 are plugged into internally accessible ports of the distribution modules 104 (e.g., see distribution modules 300, 340, 400, 450 of FIGS. 25, 30, 36, and 41). In certain examples, the first optical cables 110 are pre-cabled to the internally accessible ports to form stub cables of the distribution modules 104 prior to installation of the distribution modules 104.

Figure 18:
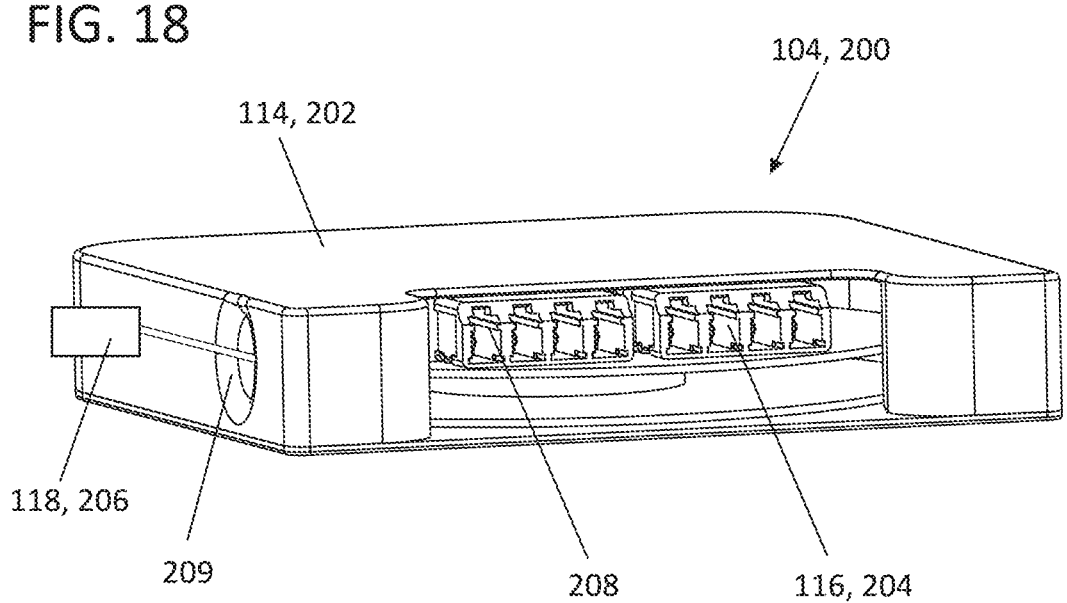
FIG. 18 is a perspective view of a fourth example distribution module suitable for use in the cabling system of FIGS. 1-10.
Figure 22:
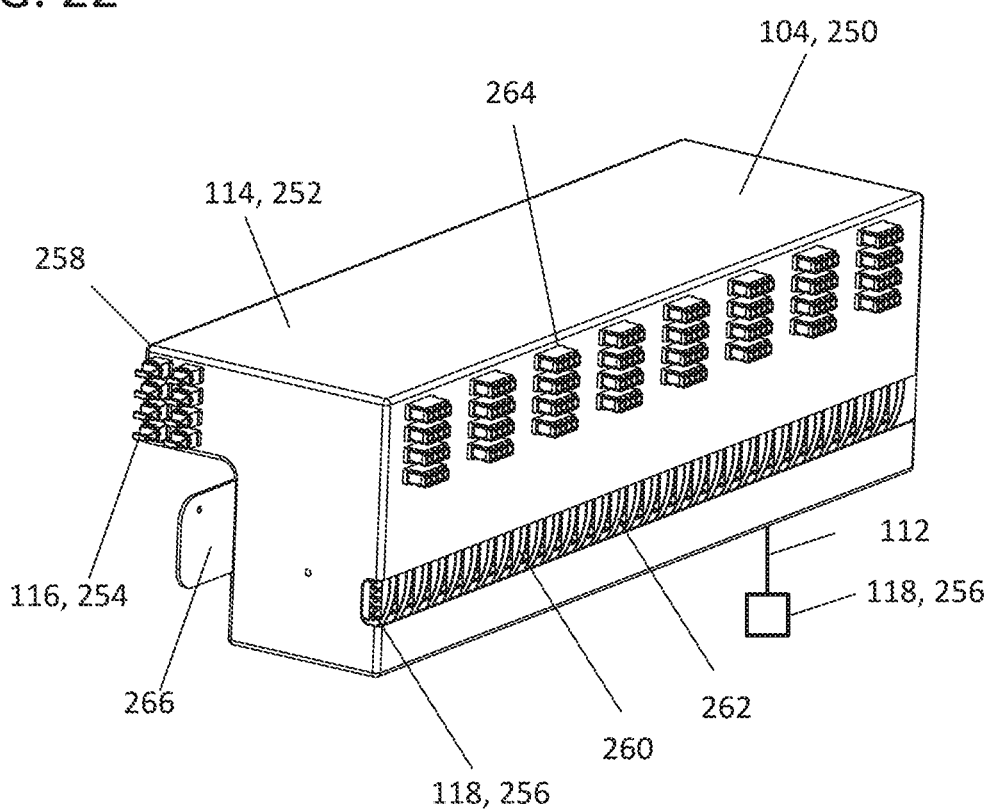
FIG. 22 is a front perspective view of a fifth example distribution module suitable for use in the cabling system of FIGS. 1-10.

In certain implementations, the second optical cables 112 are paid out from spools at the distribution modules 104 (e.g., see distribution module 200, 250, 270 of FIGS. 18, 22, and 24). In certain implementations, the second optical cables 112 are plugged into externally accessible ports of the distribution module 104 (e.g., see distribution module 140, 170, 230, 300, 340 of FIGS. 11, 14, 16, 25, and 30). In certain implementations, the second optical cables 112 are plugged into internally accessible ports of the distribution modules 104 (e.g., see distribution modules 400, 450 of FIGS. 36 and 41). In certain examples, the second optical cables 112 are pre-cabled to the internally accessible ports to form stub cables of the distribution modules 104 prior to installation of the distribution modules 104.

Figure 11:
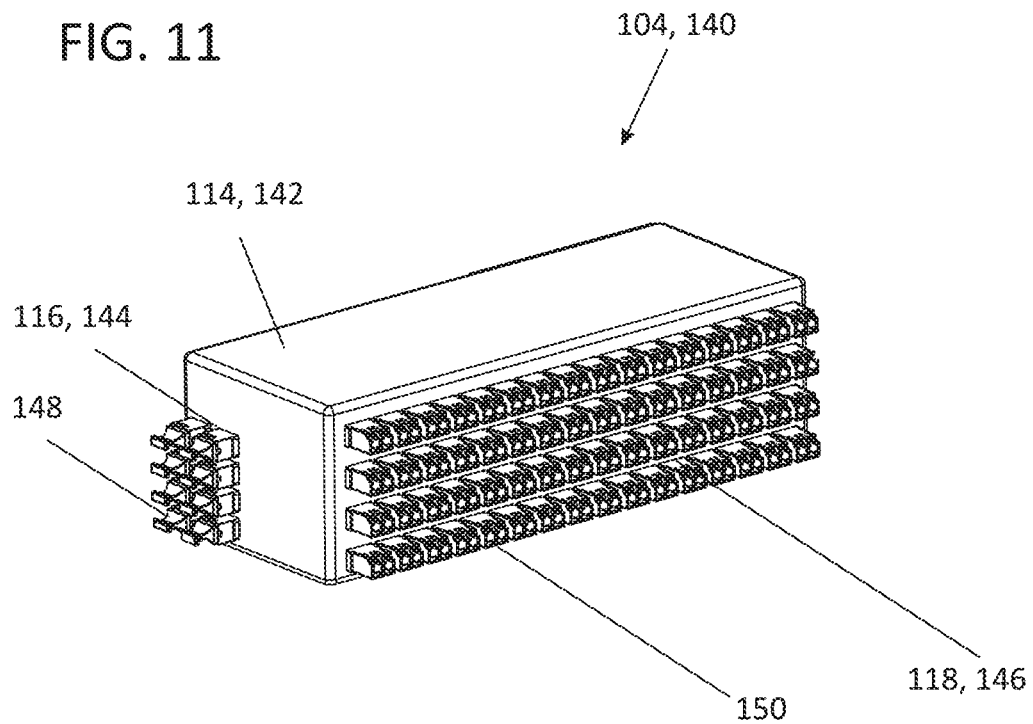
FIG. 11 is a perspective view of a first example distribution module suitable for use in the cabling system of FIGS. 1-10.
Figure 12:
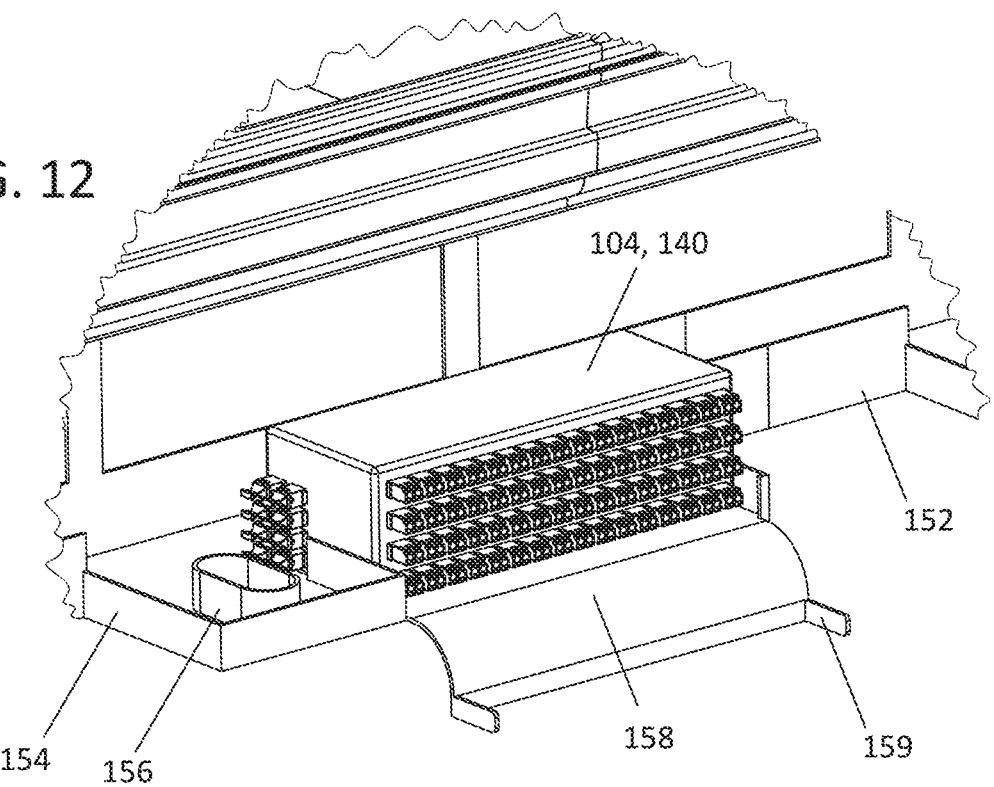
FIG. 12 illustrates the first distribution module of FIG. 11 disposed on an example raceway.

Referring to FIGS. 11-13, a first distribution module 140 is shown. The first distribution module 140 is suitable for use in the structured cabling system 100 and/or the fiber raceway arrangement 120 discussed above. The first distribution modules 140 includes a body 142 having an input 144 and an output 146. In certain examples, the input 144 faces transverse to the output 146. In the depicted example, the output 146 is horizontally oriented.

In certain examples, the input 144 includes a plurality of optical adapters 148 defining multi-fiber ports (e.g., configured to receive MPO plug connectors, SN connectors, etc.). In certain examples, the output 146 includes a plurality of optical adapters 150 defining single-fiber ports (e.g., configured to receive LC plug connectors, duplex LC plug connectors, SC plug connectors, etc.). In the depicted example, the output optical adapters 150 outnumber the input optical adapters 148.

As shown in FIG. 12, the first distribution modules 140 may seat within an example trough 152 suitable for use in the fiber raceway 102 of the structured cable system 100. It will be understood that multiple iterations of the trough 152 can be used to form a fiber raceway arrangement 120 as discussed above with reference to FIGS. 3-10. The trough 152 defines a fiber routing channel extending along a longitudinal axis of the trough 152. The trough 152 includes a lateral extension 154 on which the first distribution module 140 seats. The input 144 of the first distribution modules 140 faces parallel with the fiber routing channel of the trough 152.

In certain implementations, the lateral extension 154 provides a storage region 156 at which excess length of the first optical cables 110 may be stored. For example, one or more of the first optical cables 110 may be routed along the fiber routing channel of the trough 152, wrapped around a spool at the storage region 156, and plugged into the input optical adapters 148 at the first distribution module 140. By locating the storage region 156 within the lateral extension, the coiled excess length of cables does not interfere with routing a remainder of the first optical cables 110 along the raceway 102 to subsequent distribution modules 104.

In certain implementations, the lateral extension 154 includes a transition ramp 158 extend outwardly from the lateral extension 154. The transition ramp 158 aligns with the output 146 of the first distribution module 140 and guides the second optical cables 112 from the output 146 and the vertical drop to the respective server cabinet SE. In certain examples, the transition ramp 158 is curved to provide bend radius protection to the second optical cables 112. In certain examples, the transition ramp 158 includes retention fingers 159 that facilitate managing the second optical cables 112 within the ramp 158.

FIG. 13 illustrates a series of the troughs 152 coupled together to form a fiber raceway 102. In the example shown, the series of troughs 152 extend from one side of a transition guide 160 disposed above a switch cabinet SW. Each trough 152 carries at least one first distribution module 140. In certain examples, each trough 152 may carry multiple first distribution modules 140. In the depicted example, each first distribution module 140 aligns with one of the server cabinets SE. In other examples, each first distribution module 140 may service two server cabinets SE or two first distribution modules 140 may service one server cabinet SE. In the depicted example, the troughs 152 form an auxiliary trough below a fiber raceway 166. In other examples, the troughs 152 may form the only raceway 102 above the cabinets SW, SE.

Figure 14:
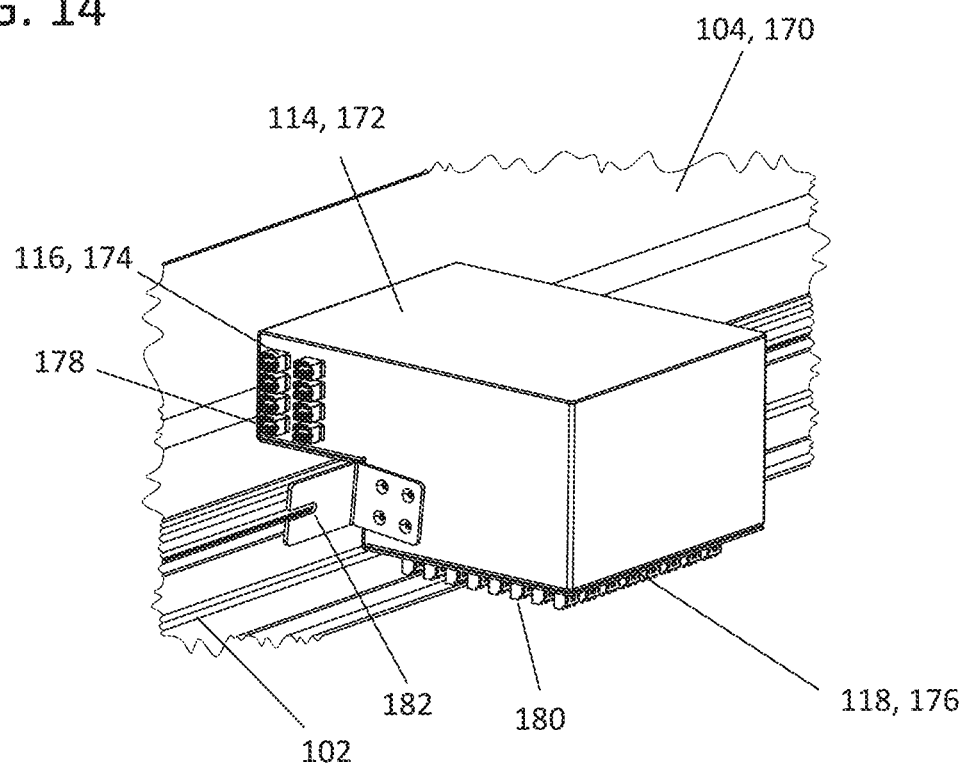
FIG. 14 is a perspective view of a second example distribution module suitable for use in the cabling system of FIGS. 1-10.
Figure 15:
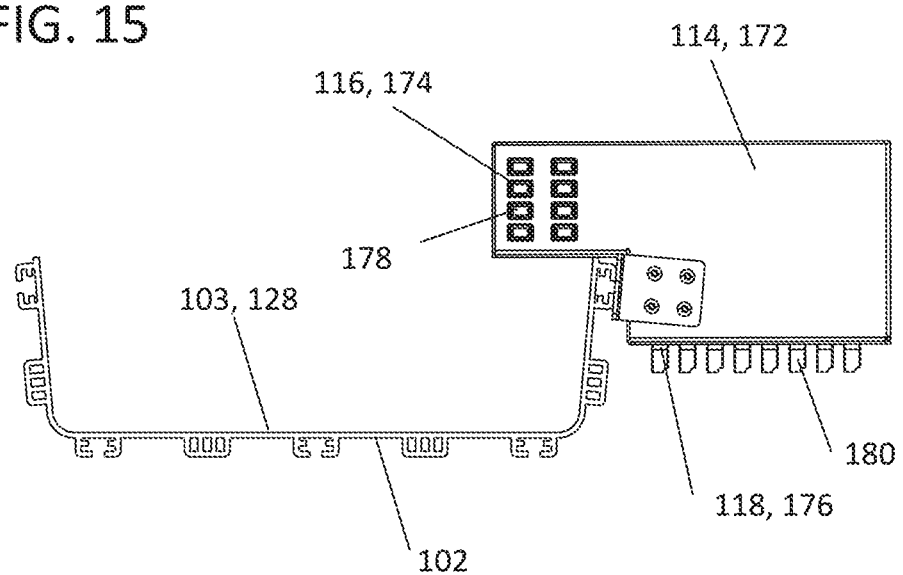
FIG. 15 is an end view of the second distribution module of FIG. 14 mounted to an example raceway.

Referring to FIGS. 14 and 15, a second example distribution module 170 is shown. The second distribution module 170 is suitable for use in the structured cabling system 100 and/or the fiber raceway arrangement 120 discussed above. The second distribution modules 170 includes a body 172 having an input 174 and an output 176. In certain examples, the input 174 faces transverse to the output 176. In the depicted example, the output 176 is vertically oriented to face towards the respective server cabinet SE. In certain examples, the body 172 includes flanges 182 with which the body 172 can be mounted to the raceway 102 (e.g., using fasteners).

In certain examples, the input 174 includes a plurality of optical adapters 178 defining multi-fiber ports (e.g., configured to receive MPO plug connectors, SN connectors, etc.). In certain examples, the output 176 includes a plurality of optical adapters 180 defining single-fiber ports (e.g., configured to receive LC plug connectors, duplex LC plug connectors, SC plug connectors, etc.). In the depicted example, the output optical adapters 180 outnumber the input optical adapters 178. In some implementations, the output adapters 180 are arranged in a grid pattern (i.e., rows and columns). Other configurations are possible.

In certain implementations, the body 172 overhangs the channel 103 defined by the raceway 102 to facilitate routing the first optical cables 110 to the input 174 of the second distribution module 170. In certain implementations, the body 172 also extends outwardly from an exterior of the raceway 102 so that the output 176 faces towards the server cabinet SE without interference from the raceway 102. Optical circuitry is routed within the body 172 to optically couple the input 174 and the output 176. For example, one end of the optical circuitry may plug into internal ports defined by the input adapters 178 and the other end of the optical circuitry may plug into internal ports defined by the output adapters 180.

Figure 17:
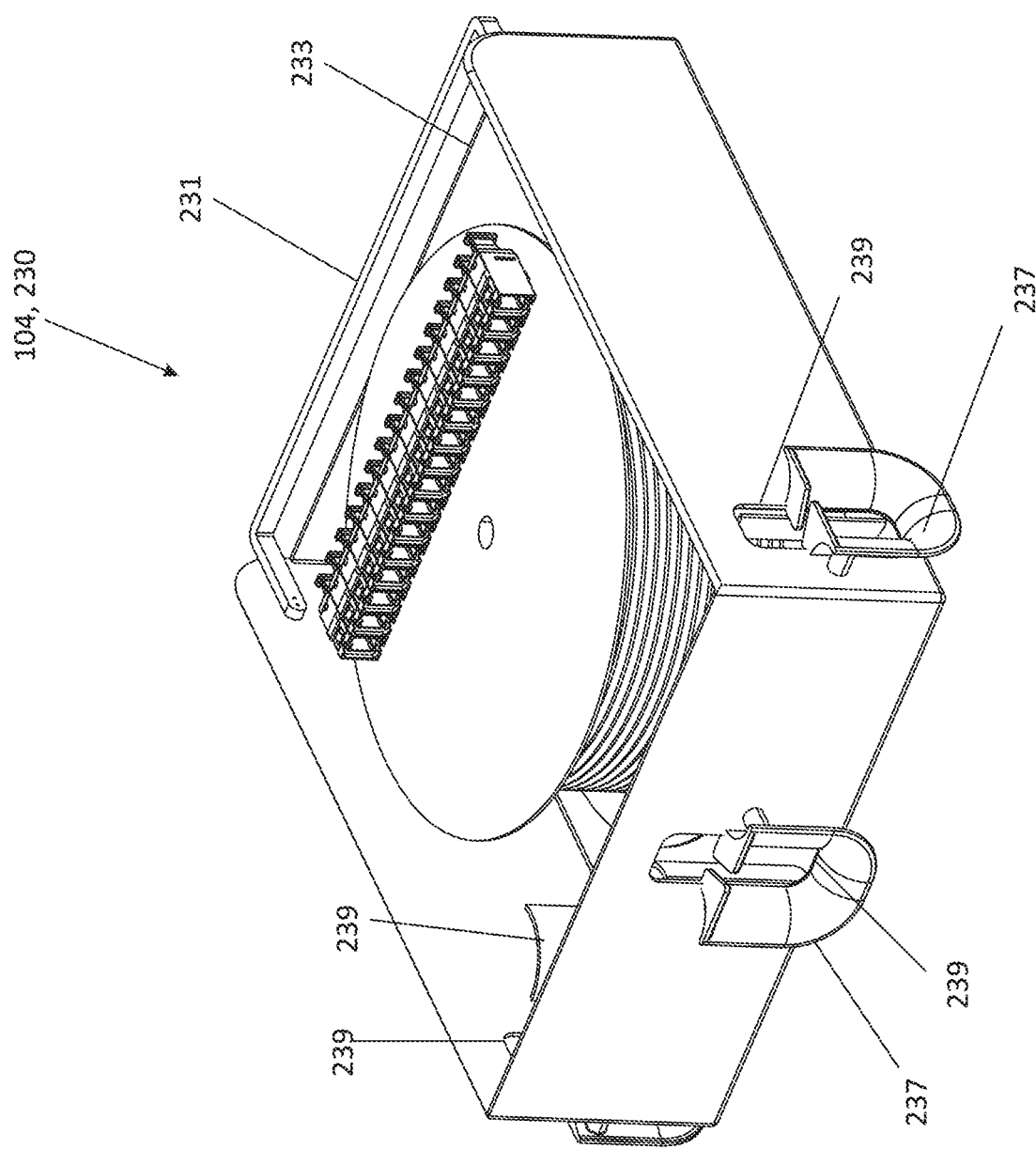
FIG. 17 is a rear perspective view of the third distribution module of FIG. 16.

Referring to FIGS. 16 and 17, a third example distribution module 230 is shown. The third distribution module 230 is suitable for use in the structured cabling system 100 and/or the fiber raceway arrangement 120 discussed above. The third distribution modules 230 includes a body 232 having an input 234 and an output 236. The third distribution module 230 includes a spool 240 that mounts within the housing 232. The spool 240 carries one or more optical adapters 238 to rotate in unison with the spool 240. One or more optical cables can be wound around the spool 240. First ends of the one or more optical cables are plugged into inwardly facing ports of the optical adapters 238. Second ends of the one or more optical cables extend through an aperture 239 defined in the housing 232.

In some implementations, the second connectorized ends of the optical cables define the input 234 and externally facing ports of the optical adapters 238 define the output 236. In such implementations, the third distribution module 230 is mounted to the raceway 102 so that one or more first ends of one or more first optical cables 110 can be paid out from the spool 240 through the aperture 239 and along the raceway channel 103 towards the switch cabinet SW. When the first optical cable(s) 110 have been paid out, connectorized ends of second optical cables 112 can be routed into the body 232 (e.g., through an aperture 233) and plugged into externally facing ports of the optical adapters 238.

In other implementations, the second connectorized ends of the optical cables define the output 236 and externally facing ports of the optical adapters 238 define the input 234. In such implementations, the third distribution module 230 is mounted to the raceway 102 so that connectorized ends of one or more second optical cables 112 can be paid out from the spool 240 through the aperture 239 and towards the server cabinet(s) SE. When the second optical cable(s) 112 have been paid out, one or more connectorized ends of one or more first optical cables 110 can be routed into the body 232 (e.g., through an aperture 233) and plugged into externally facing ports of the optical adapters 238.

In certain implementations, the spool 240 carries a plurality of optical adapters 238. In certain examples, the adapters 238 are disposed in a row. In certain examples, the spool 240 carries a sufficient number of optical adapters 238 to receive connectorized ends from a plurality of optical cables (e.g., first optical cables 110 or second optical cables 112) wound around the spool 240.

In certain implementations, the body 232 includes multiple apertures 239 through which the cable(s) extend out of the body 232 from the spool 240. In certain examples, the body 232 may define apertures 239 facing in different directions. In certain examples, the body 232 includes oppositely facing apertures 239. Accordingly, the body 232 may be mounted within the raceway channel 103, above the raceway channel 103, or on a lateral extension of the raceway 102 (e.g., see FIG. 12) in either of two different orientations and still have an aperture 239 that faces along the raceway channel 103 towards the switch cabinet SW. In the depicted example, the body 232 also defines an aperture 239 that faces towards the raceway 102. Accordingly, the body 232 also can be mounted to an outside of the raceway 102 with the aperture 239 aligned with an aperture defined through a sidewall of the raceway 102.

In certain implementations, a first set of bend radius limiters 235 can be disposed within the body 232 at the apertures 239 to guide the cable(s) from the spool 240 to the apertures 239. The first set of bend radius limiters 235 inhibit excessive bending of the optical cable(s) (e.g., beyond a bend radius limit of the cable(s)) as the cable(s) pass through the aperture 239. In certain implementations, a second set of bend radius limiters 237 are disposed outside of the body 232 at the apertures 239 to inhibit excessive bending of the optical cable(s) being paid out from the body 232. In some examples, the bend radius limiters 235 are separate pieces from the bend radius limiters 237. In other examples, a bend radius limiter 237 forms a continuous piece with a respective bend radius limiter 235.

In certain implementations, the body 232 defines an aperture 233 through which cables (e.g., second optical cables 112 or first optical cables 110) enter the body 232 to plug into the externally facing ports of the optical adapters 238. In the depicted example, the aperture 233 extends along an entire width of the body 232. In other examples, the aperture 233 may be shorter. In the depicted example, the aperture 233 is bounded by the body 232 and a retention rail 231 that mounts to and extends outwardly beyond the body 232 (e.g., see FIG. 17). In other examples, the aperture 233 could be defined completely by the body 232 or between the body 232 and a cover (not shown). In still other examples, the cables may extend through an open-topped notch defined in the body 232.

Referring to FIGS. 18-21, a fourth example distribution module 200 is shown. The fourth distribution module 200 is suitable for use in the structured cabling system 100 and/or the fiber raceway arrangement 120 discussed above. The fourth distribution modules 200 includes a body 202 having an input 204 and an output 206. The fourth distribution module 200 also includes a spool 210 that mounts within the housing 202. The spool 210 carries one or more optical adapters 208 to rotate in unison with the spool 210. One or more optical cables can be wound around the spool 210. In a preferred embodiment, a single cable is wound around the spool 210. One or more first ends of the optical cable are plugged into inwardly facing ports of the optical adapters 208. One or more second ends of the optical cable extend through an aperture 209 defined in the housing 202.

Figure 19:
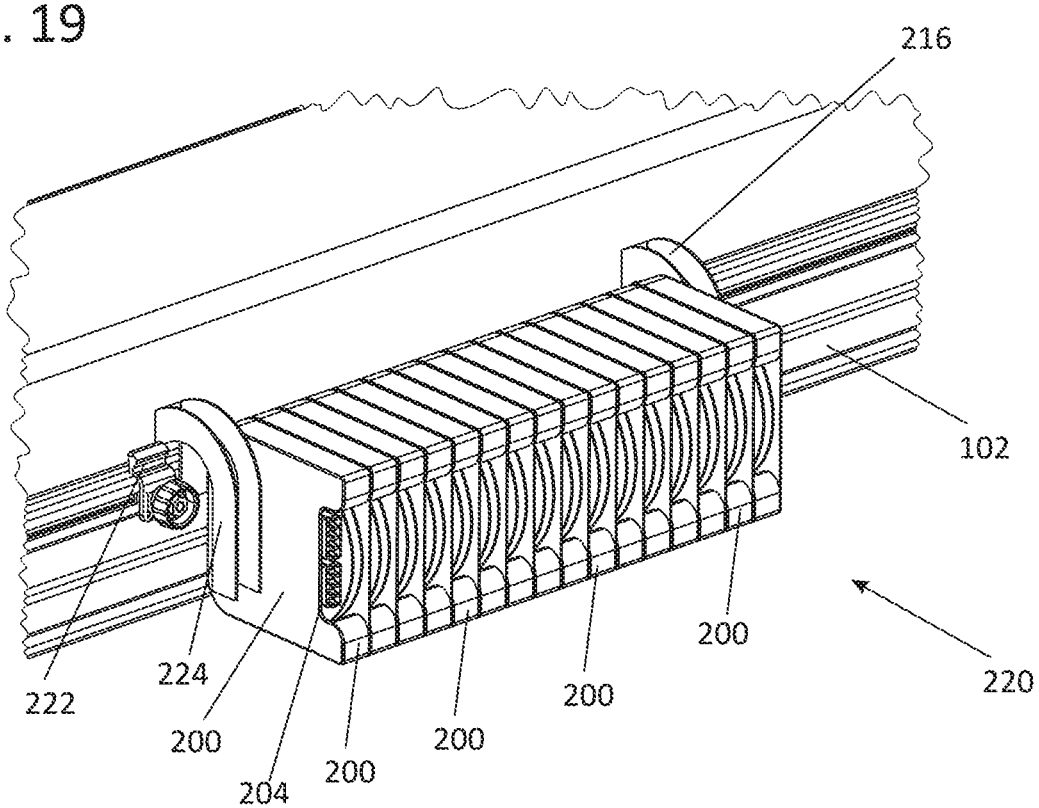
FIG. 19 is a perspective view of an example distribution module arrangement implemented using multiple iterations of the fourth distribution module of FIG. 18.

In the example depicted in FIG. 19, the fourth distribution module 200 is oriented so that the aperture 209 faces vertically downwardly towards the rack R (e.g., towards a respective one of the server cabinets SE). In such an implementation, the cable wound around the spool 210 is one of the second optical cables 112, which can be paid out from the fourth distribution module 200 towards the server cabinet(s) SE. A first optical cables 110 may be routed along the raceway 102 towards the distribution module 200 and be plugged into one or more of the externally facing ports of the one or more optical adapters 208. Accordingly, in such an implementation, the externally facing port(s) of the optical adapter(s) 208 defines the input 204 and the second connectorized end(s) of the second optical cable 112 defines the output 206 of the module.

In other implementations, however, the fourth distribution module 200 can be oriented so that the aperture 209 faces (e.g., horizontally) towards a channel 103 of the raceway 102 and the externally facing port(s) of the optical adapter(s) 208 face towards the rack R. In such implementations, a first optical cable 110 can be paid out from the spool 210 through the aperture 209 and one or more second optical cables 112 can be plugged into the externally facing port(s).

As further shown in FIG. 19, one or more of the distribution modules 200 can be disposed together in a distribution module arrangement 220. For example, a plurality of the distribution modules 200 can be arranged in a row. In some examples, the distribution modules 200 are attached to the raceway 102 using a common bracket 222. In other examples, the distribution modules 200 are separately attached to the raceway 102. In some examples, each distribution module 200 receives a respective one of the first optical cables 110. In other examples, some fibers of a first optical cable 110 may be routed to one distribution module 200 while other fibers of the first optical cable 110 may be routed to another distribution module 200. In still other examples, one of the distribution modules 200 may receive multiple first optical cables 110.

In certain implementations, the fourth distribution module arrangement 220 includes management structure 224 that guides the first optical cables 110 out of the raceway 102 so that the first optical cables 110 can be plugged into the externally facing ports of the optical adapters 208. In certain examples, the management structure 224 defines a curved ramp extending over a top and outer side of the raceway 102. In the depicted example, the curved ramp 224 has guide walls that retain the first optical cables 110 within the ramp 224. Other configurations are possible. In certain examples, the distribution module arrangement 220 includes a management structure 224 at each of opposite ends of the distribution module arrangement 220 (e.g., see FIG. 19). In other examples, one or more of the management structures 224 can be disposed along the row of distribution modules 200 (e.g., between two distribution modules 200 in the row). In still other examples, a single management structure 224 may service all of the distribution modules 200 within the distribution module arrangement 220. In certain examples, the management structure(s) 216 are carried by the bracket 222.

Figure 20:
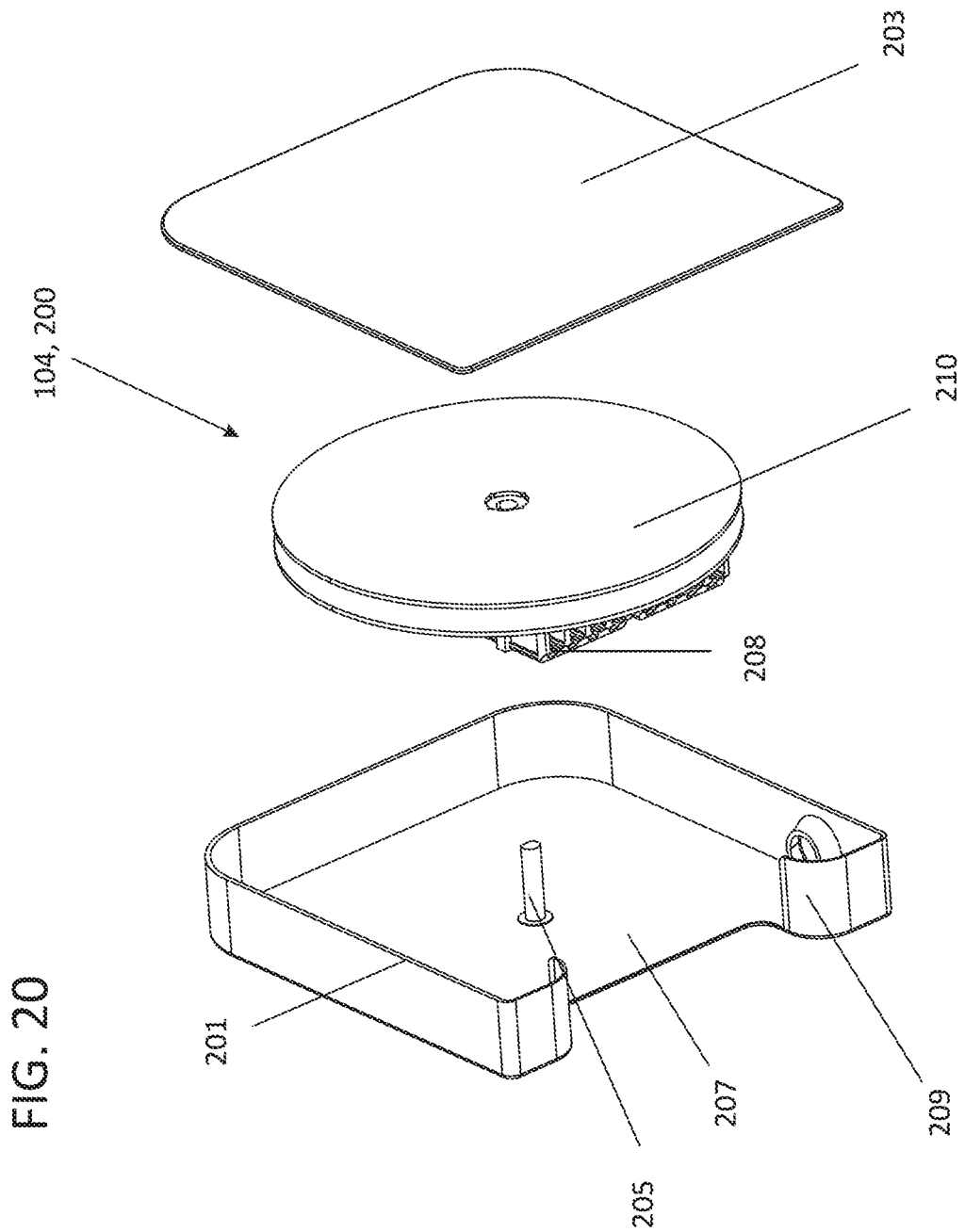
FIG. 20 is a perspective view showing the fourth distribution module with the components exploded away from each other.

FIG. 20 illustrates one example implementation of fourth distribution module 200 including the spool 210 mounted within a two-piece body 202. The body 202 includes a base 201 and a cover 203 that mounts to the base 201. The base 201 includes a spindle 205 about which the spool 210 rotatably mounts so that the spool 210 is rotatable relative to the body 202 about an axis defined by the spindle 205. The base 201 defines the aperture 209 through which the second end of the cable is paid out from the spool 210. The base 201 also defines an opening 207 that provides access to the optical adapter(s) 208 carried by the spool 210 (e.g., see FIG. 18). In certain examples, the base 201 defines contoured guide walls 209 leading to the opening 207. The guide walls 209 may provide bend radius protection to the cables (e.g., first optical cables 110) routed to the adapter(s) 208. It will be understood that other configurations are possible. For example, the body 202 may not include a cover and the spool 210 will be sandwiched between the base 201 and a base of an adjacent module 200 or between the base 201 and the bracket 218.

Figure 21:
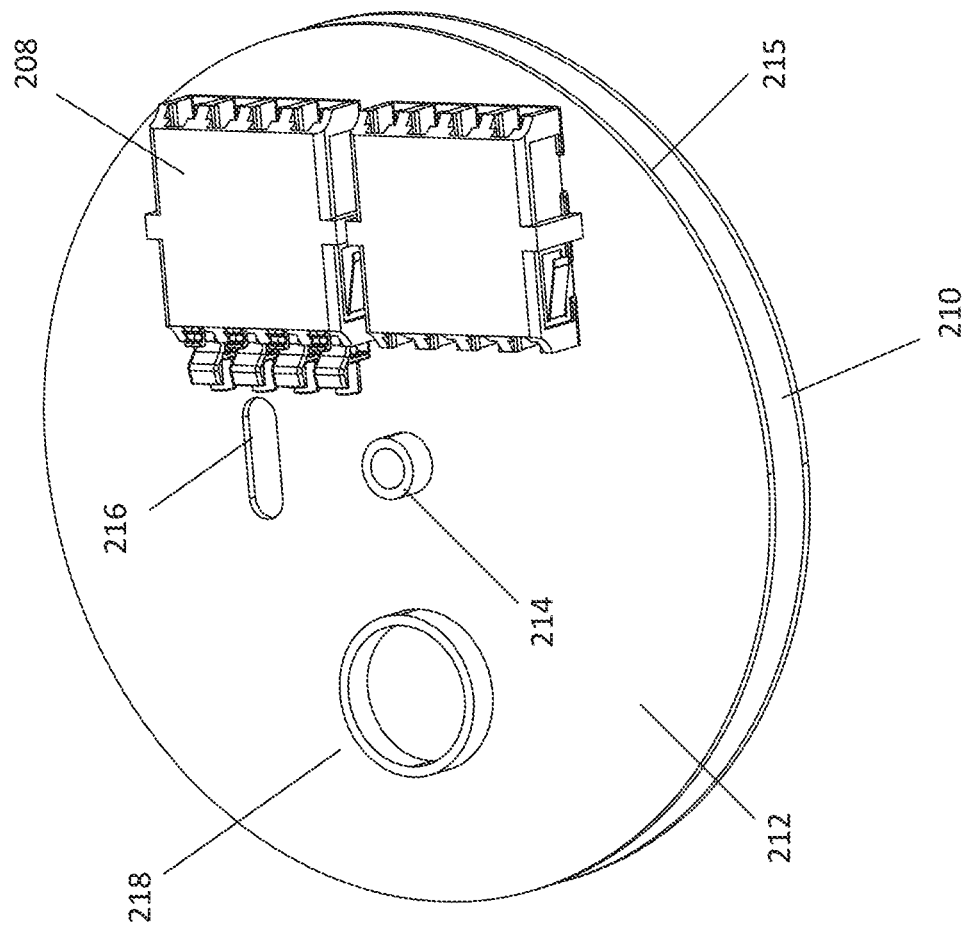
FIG. 21 is a perspective view of an example spool suitable for use in the fourth distribution of FIG. 18.

FIG. 21 illustrates one example implementation of the spool 210 suitable for use with the fourth distribution module 200. The spool 210 includes a winding region 215 disposed between first and second radial flanges 212. A central through passage 214 extends through the spool 210 to receive the spindle 205 of the body 202. The one or more adapters 208 are mounted to an external surface of one of the radial flanges 212 so that the adapter(s) 208 rotate in unison with the spool 210. The radial flange 212 also defines a slot 216 through which a cable can pass between the winding region 215 and the adapter(s) 208. In certain examples, a management structure 218 is provided at the external surface of the radial flange 212 to facilitate guiding the first end(s) of the cable from the slot 216 to the internally facing ports of the adapter(s) 208. In the depicted example, the management structure 218 includes a spool. It will be understood that the slot 216 and management structure 218 also can be used on the spool 240 of the third distribution module 230.

In certain examples, the cable wound around the spool 210 (e.g., a second optical cable 212) includes multiple optical fibers that are separately connectorized at the first end of the cable. The cable extends from the winding region 215, through the slot 216, around the spool 218, and towards the adapters 208 so that each connectorized fiber end is plugged into one of the internally facing ports of the optical adapters 208. In some implementations, the second ends of the optical fibers of the cable are connectorized at one or more multi-fiber plug connectors (e.g., an MPO connector, an SN connector, a duplex LC connector, etc.). In other implementations, the second end of the cable fibers are separately connectorized at single-fiber plug connectors (e.g., an LC connector, an SC connector, etc.).

Figure 23:
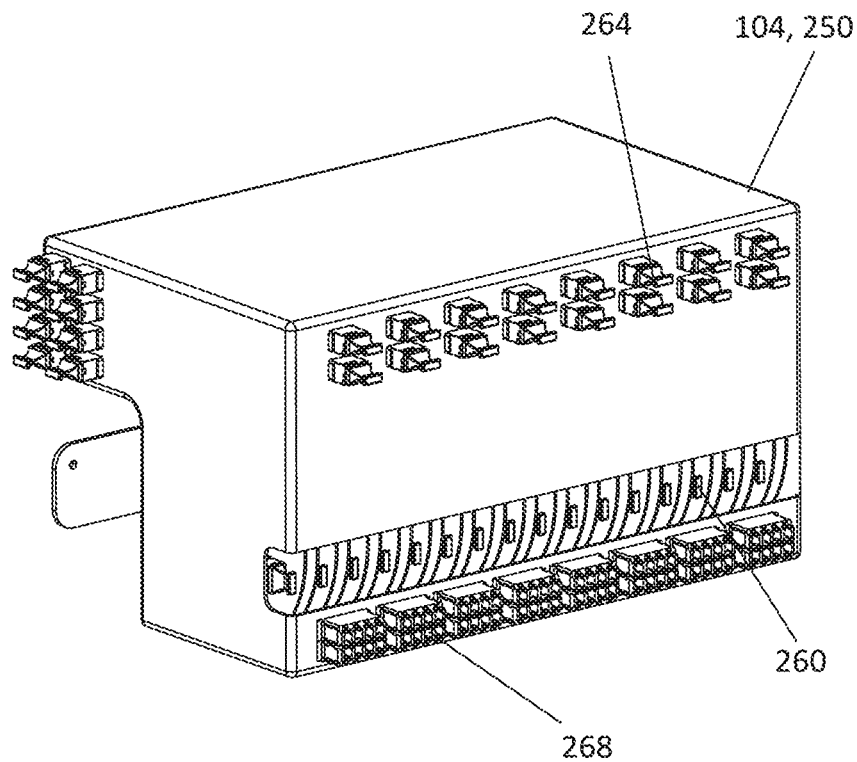
FIG. 23 illustrates the fifth distribution module with multi-fiber intermediate cabling and optional connector holders suitable for use with any of the distribution modules disclosed herein having spools from which the second optical cables can be paid out.

Referring now to FIGS. 22 and 23, a fifth distribution module 250 combines concepts of the first distribution module 140 with the fourth distribution module 200. The fifth distribution module 250 is suitable for use in the structured cabling system 100 and/or the fiber raceway arrangement 120 discussed above. The fifth distribution modules 250 includes a body 252 having an input 254 and an output 256. In certain examples, the input 254 faces transverse to the output 256. In the depicted example, the output 256 is horizontally oriented.

In certain implementations, the input 254 includes a plurality of optical adapters 258 carried by the body 252 and the output 256 includes connectorized ends of cables wound around one or more spools 262 disposed within the body 252. In such implementations, one or more first optical cables 110 are routed along the raceway channel 103 towards the fifth distribution module 250 and plugged into external ports of the input adapters 258. The second optical cables 112 can be paid out from the spools 262 (e.g., through one or more apertures defined in the body 252) towards the respective server cabinet(s) SE. When the second optical cables 112 have been paid out, the second optical cables 112 are optically coupled to the first optical cables 110.

In certain implementations, the body 252 of the fifth distribution module 250 carries one or more intermediate adapters 264 configured to optically couple the first and second optical cables 110, 112. In certain examples, internal optical circuitry has first connectorized ends plugged into internal ports of the input adapters 258 and second connectorized ends plugged into internal ports of the intermediate adapters 264. Accordingly, optical signals of the first optical cables 110 received at the input adapters 258 are accessible from external ports of the intermediate adapters 264. Each spool 262 carries one or more optical adapters 260. Connectorized ends of the second optical cables 112 are plugged into internally facing ports of the spool adapters 260 to rotate with the spools 262. When the second optical cables 112 have been paid out, jumper cables can be plugged into external ports of the intermediate adapters 264 and externally facing ports of the spool adapters 260, thereby optically coupling the first and second optical cables 110, 112.

In certain implementations, the input adapters 258 define one or more multi-fiber ports (e.g., MPO adapters, SN adapters, etc.). In certain implementations, the input adapters 258 are different from the intermediate adapters 264 and the spool adapters 260. For example, the intermediate adapters 264 and spool adapters 260 may define one or more single-fiber ports (e.g., SC adapters, LC adapters, duplex LC adapters, etc.). In another example, the intermediate adapters 264 and spool adapters 260 may define multi-fiber ports with a different fiber count from the multi-fiber ports of the input adapters 258. In the example depicted in FIG. 22, the intermediate adapters 264 and spool adapters 260 include quad adapters that each define four external single-fiber ports. In the example depicted in FIG. 23, the intermediate adapters 264 and the spool adapters 260 include multi-fiber port adapters. In still other implementations, the intermediate adapters 264 are replaced with intermediate stub cables extending outwardly from the body 252 and having connectorized ends that can be plugged into the externally facing ports of the spool adapters 260.

In certain implementations, the body 252 includes or attaches to a bracket 266 by which the fifth distribution module 250 is mounted to the raceway 102. In certain examples, the bracket 266 mounts to an exterior side of the raceway 102. In other examples, the bracket 266 can be configured to mount to a top and/or bottom of the raceway 102. In certain implementations, the body 252 includes an input section that extends into or over the raceway channel 103. In certain implementations, an output section is disposed at an outer side of the raceway 102. In certain examples, the body 252 has an L-shaped transverse cross-section.

In certain implementations, the fifth distribution module 250 includes one or more connector holders 268. In use, the connectorized end 256 of the second optical cable 112 can be stored at the connector holder 268 when not in use (e.g., prior to paying out the second optical cable 112 to the server cabinet SE. In certain examples, the connector holder 268 defines one or more storage receptacles each configured to receive a plug connector. In certain examples, the storage receptacles have externally accessible ports. In certain examples, the storage receptacles do not include alignment structure for aligning together two plug connectors. In some examples, the storage receptacles are each configured to receive single-fiber plugs. In other examples, the storage receptacles are each configured to receive multi-fiber plugs. In other examples, each connector holder 268 includes latch arms or other such structure that holds the plug connector. In certain examples, each connector holder 268 is configured to receive a plurality of plug connectors.

FIG. 24 illustrates a sixth example distribution module 270 that allows both the first optical cables 110 and the second optical cables 112 to be paid out from the distribution module 270. The sixth distribution module 270 is suitable for use in the structured cabling system 100 and/or the fiber raceway arrangement 120 discussed above. The sixth distribution modules 270 includes a body 272 having an input 274 and an output 276. The input 274 is defined by one or more connectorized ends of one or more first optical cables 110. The output 276 is defined by one or more connectorized end of one or more second optical cables 112.

The sixth distribution module 270 includes a first spool 278 rotatably mounted to the body 272. For example, the first spool 278 may be mounted within an interior of the body 272. One or more of the first optical cables 110 are wound around the first spool 278. Each of the one or more first optical cables 110 includes multiple optical fibers. A first end of each first optical cables 110—terminated by one or more plug connectors—is paid out from the first spool 278 to pull the first end along the raceway channel 103 to the switch cabinet SW. An opposite second end of the first optical cables 110—terminated by one or more plug connectors—rotates in unison with the first spool 278. For example, the second end may be clipped, tied, or otherwise secured to the first spool 278. In certain examples, the second end includes a plurality of connectorized pigtails.

The sixth distribution module 270 includes one or more second spools 282 rotatably mounted to the body 272. For examples, the second spools 282 may be mounted within an interior of the body 272 with the first spool 278. In certain examples, the second spools 282 are each smaller than the first spool 278. In certain examples, each of the second spools 282 holds a single one of the second optical cables 112 while the first spool 278 holds a plurality of first optical cables 110. In certain examples, each of the second spool 282 holds a single-fiber cable while the first spool 278 holds a multi-fiber cable. In certain examples, the second spools 282 rotate about an axis that is angled relative to a rotation axis of the first spool 278. In the depicted example, the rotation axes of the second spools 282 are horizontal while the rotation axis of the first spool 278 is vertical. In certain examples, the second spools 282 rotate about a common axis with each other.

Each of the second spools 282 carries an optical adapter 284 having opposite first and second ports. A connectorized end of the respective second optical cable 112 is plugged into the first port of the adapter 284. Accordingly, the connectorized end and the adapter 284 rotate in unison with the second spool 282 when the output 276 (e.g., the other connectorized end of the second optical cable 112) is paid out from the second spool 282. When the second optical cable 112 has been paid out, one of the connectorized pigtails from the first spool 278 is routed to the second spool 282 and plugged into the second port of the adapter 284. Accordingly, the first optical cables 110 are optically coupled to the second optical cables 112.

In certain implementations, the body 272 defines one or more apertures 279 through which the first optical cables 110 can exit the body 272 when paid out from the first spool 278. In certain examples, bend radius limiters can be positioned at the apertures 279 (e.g., similar to bend radius limiters 235, 237 of FIGS. 16 and 17). In certain examples, apertures 279 can be provided on opposite ends of the body 272 to align with or above a raceway channel 103 when the sixth distribution module 270 is mounted to the raceway 102.

In certain implementations, the body 272 defines one or more apertures 286 disposed beneath the second spools 282. The second cable 112 extends through the one or more apertures 286 to exit the body 272. In the depicted example, the body 272 defines an aperture 286 aligned with each second spool 282. In other examples, the body 272 defines a single elongate aperture through which multiple (e.g., all) of the second cables 112 pass. In some implementations, the body 272 allows the second cables 112 to extend directly down towards the server cabinets SE. In other implementations, the body 272 includes a shelf 288 disposed beneath the one or more apertures 286. The second cables 112 can be routed in one or both directions off the shelf 288. Accordingly, the shelf 288 facilitates management of the second optical cables 112 by helping to bundle the second optical cables 112 together before the vertical drop towards the rack R.

FIGS. 25-28 illustrate a seventh example distribution module 300 is suitable for use in the structured cabling system 100 and/or the fiber raceway arrangement 120 discussed above. The seventh distribution modules 300 includes a body 302 having an input 304 and an output 306. The body 302 carries one or more optical adapters 308 each having at least one internally accessible port and at least one externally accessible port. In certain examples, the input 304 includes the at least one internally accessible port and the output 306 includes the at least one externally accessible port of an optical adapter 308. One or more first optical cables 110 are routed into the body 302 of the seventh distribution module 300 and plugged into the one or more internally accessible ports 304. One or more second optical cables 112 are routed to an exterior of the body 302 are plugged into the one or more externally accessible ports 306 to optically couple the second optical cables 112 to the first optical cables 110.

In certain implementations, the body 302 carries a plurality of optical adapters 308. In certain examples, each optical adapter 308 defines one or more internally accessible ports and one or more externally accessible ports. In some examples, each optical adapter 308 defines one or more internally accessible multi-fiber ports (e.g., configured to receive an MPO plug connector, an SN plug connector, etc.) and corresponding externally accessible multi-fiber ports. In other examples, each optical adapter 308 defines one or more internally accessible single-fiber ports (e.g., configured to receive an LC plug, a duplex LC plug, an SC plug, etc.). In the depicted example, the body 302 carries six SN adapters.

Figure 26:
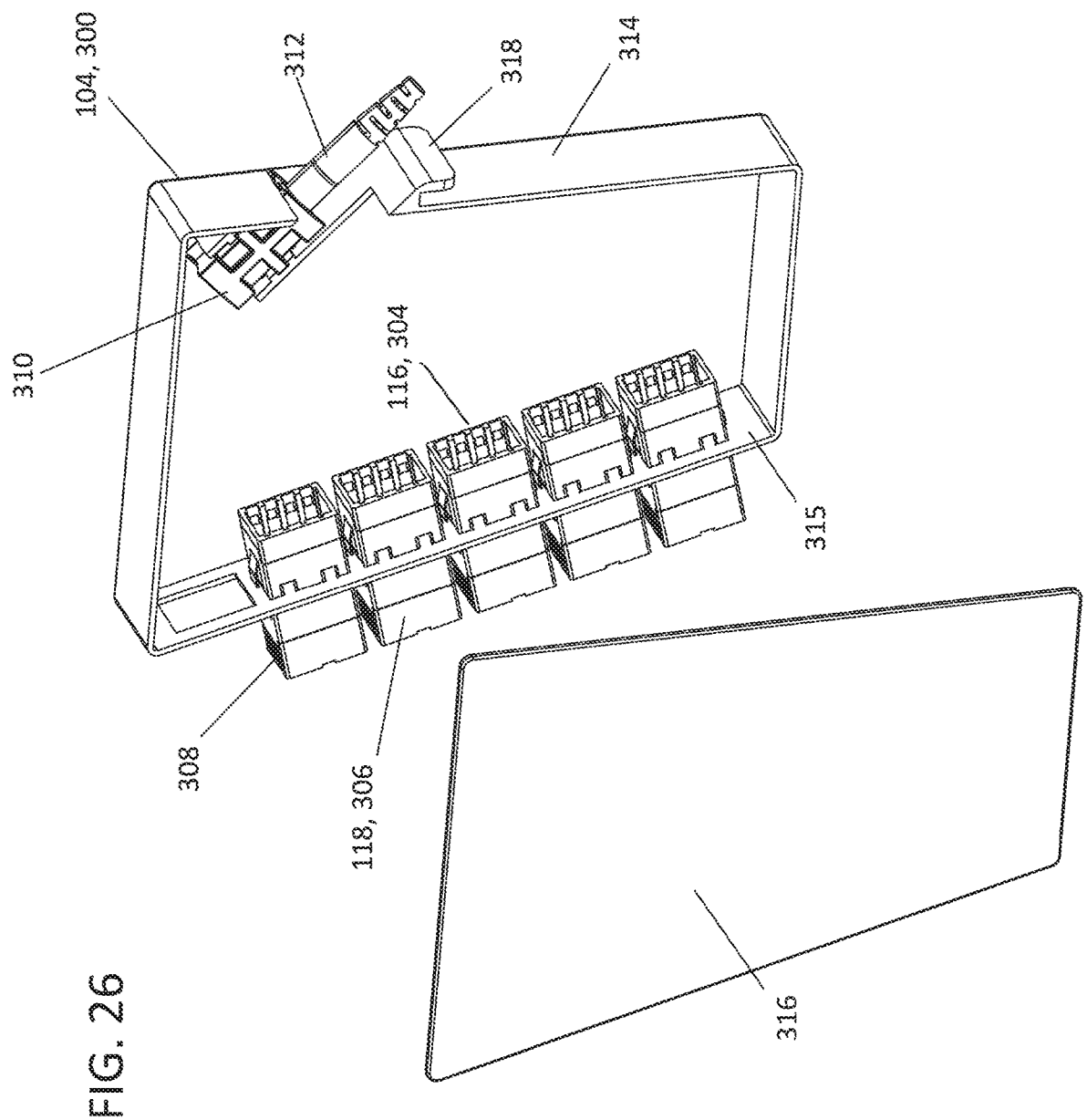
FIG. 26 shows a cover exploded from a remainder of the seventh distribution module of FIG. 25 for ease in viewing internal components.

As shown in FIG. 26, the first optical cable(s) 110 can be anchored to the housing 302 at an anchoring location. For example, a pigtail adapter 310 can be mounted to the housing 302 at the anchoring location. The pigtail adapter 310 does not include ferrule alignment structure. Rather, the pigtail adapter 310 defines a through-passage through which the one or more first optical cables 110 extend. For example, the first optical cable(s) 110 may extend through the pigtail adapter 310 so that connectorized ends of the first optical cable(s) 110 plug into the internally accessible ports of the optical adapters 308. In certain example, the pigtail adapter 310 also defines retention structure (e.g., flexible latch arms) at an externally accessible port of the pigtail adapter 310. A cable protection arrangement 312 carried by the first optical cable(s) 110 plugs into the externally accessible port of the pigtail adapter 310 to anchor the first optical cable(s) 110 to the pigtail adapter 310. In certain examples, the cable protection arrangement 312 also includes a strain relief boot for providing tensile strain relief to the one or more first optical cables 110. Examples of pigtail adapters 310 and cable protection arrangement 312 suitable for use with the distribution modules disclosed herein are disclosed in PCT Publication No. WO 2019/204317 (e.g., see FIG. 137A), the disclosure of which is hereby incorporated by reference in its entirety.

In certain implementations, the body 302 includes an angled face 315 at which the optical adapters 308 are mounted. In the depicted example, the face 315 is angled partially downwardly towards the rack R to inhibit strain on the second optical cables 112 routed to the optical adapters 308. In certain implementations, the body 302 is a multi-piece body. In the example depicted in FIG. 26, the body 302 includes a base 314 and a cover 316 that cooperate to define an interior in which the pigtail adapter 310 is mounted. In certain implementations, the body 302 of each distribution module 300 includes a hook 318 that seats over the common bracket 322, over a respective bracket, or over the raceway 102.

Figure 27:
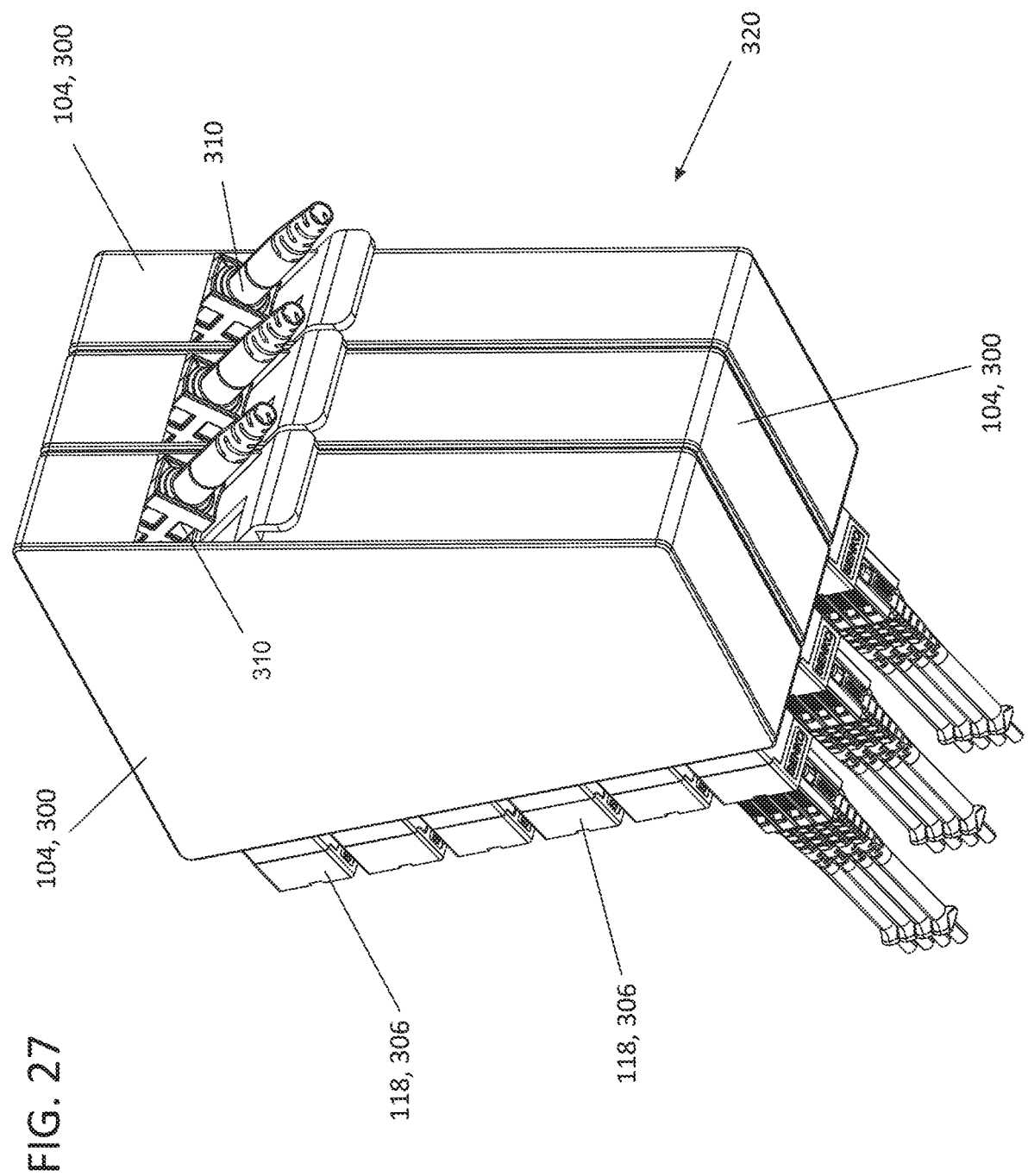
FIG. 27 is a rear perspective view of an example distribution module arrangement implemented using multiple iterations of the seventh distribution module of FIG. 25.

As shown in FIG. 27, one or more of the distribution modules 300 can be disposed together in a distribution module arrangement 320. For example, a plurality of the distribution modules 300 can be arranged in a row. In some examples, the distribution modules 300 are attached to the raceway 102 using a common bracket 322 (e.g., see FIGS. 28 and 29). In other examples, the distribution modules 300 are separately attached to the raceway 102. In some examples, each distribution module 300 receives a respective one of the first optical cables 110. In other examples, some fibers of a first optical cable 110 may be routed to one distribution module 300 while other fibers of the first optical cable 110 may be routed to another distribution module 300. In still other examples, one of the distribution modules 300 may receive multiple first optical cables 110.

Figure 28:
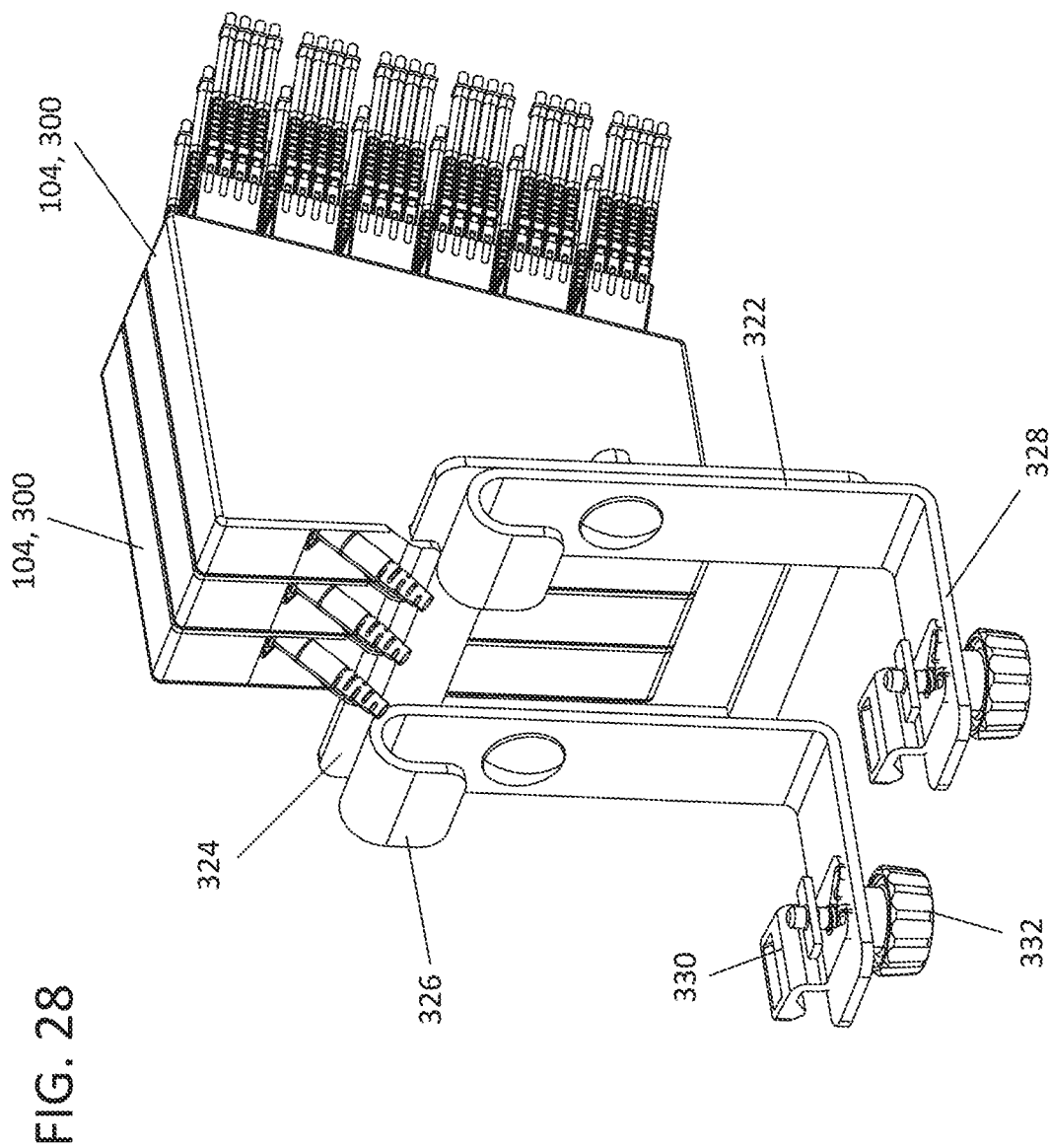
FIG. 28 is a rear perspective view of the distribution module arrangement of FIG. 27 mounted to a common bracket.
Figure 29:
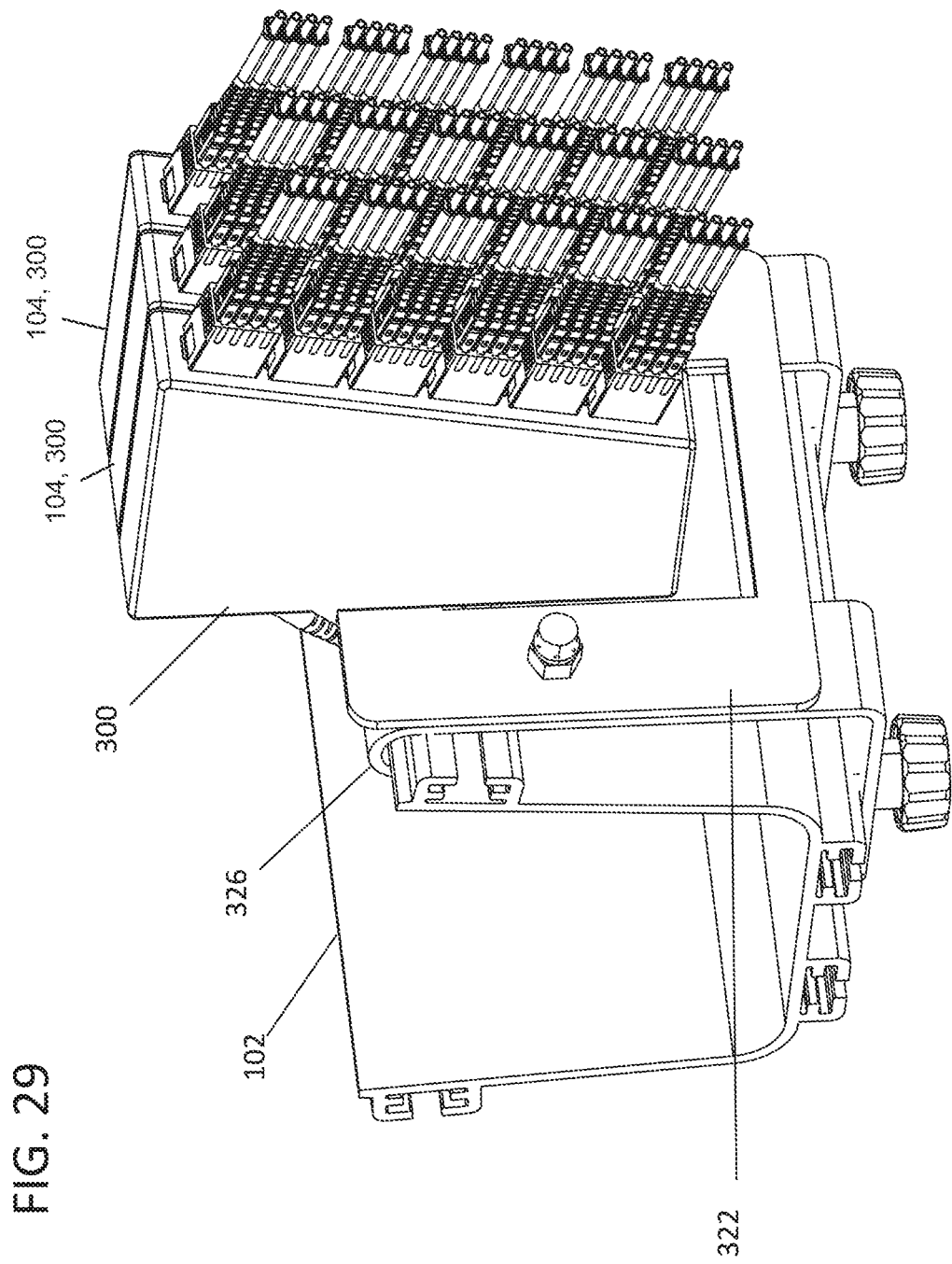
FIG. 29 is a front perspective view of the distribution module arrangement of FIG. 28 mounted to a raceway via the bracket of FIG. 28.
Figure 30:
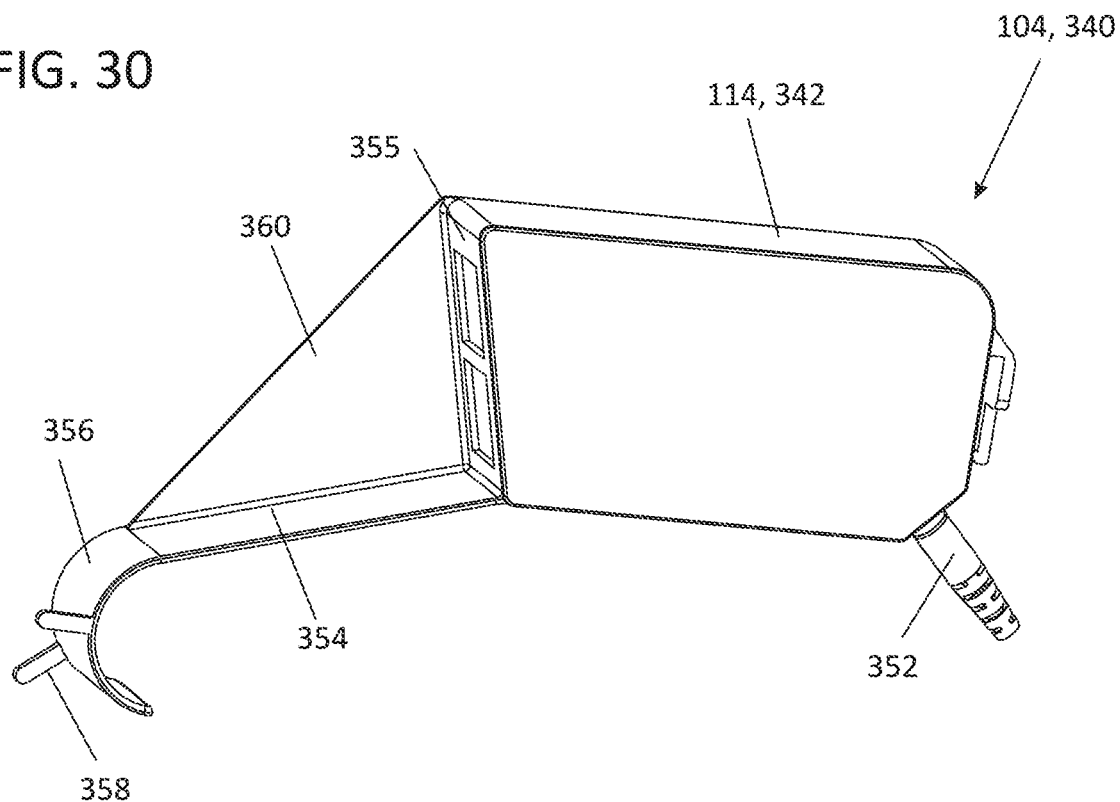
FIG. 30 is a front perspective view of an eighth example distribution module suitable for use in the cabling system of FIGS. 1-10.

FIGS. 28 and 29 illustrate a bracket 322 suitable for mounting any of the distribution modules disclosed herein to a raceway 102. The bracket 322 includes a framework 324 to which the distribution modules, such as distribution module 300, can attach. For example, distribution module 300 includes a hook 318 that hangs on the framework 324. In other examples, mounting flanges or sections of the module bodies can be fastened, latched, or otherwise coupled to the bracket framework 324.

In certain examples, the bracket 322 includes hooks 326 that extend from the framework 324 in an opposite direction from the distribution modules. The hooks 326 are configured to hang over a top edge of a raceway 102 (e.g., see FIG. 29). In certain examples, the bracket 322 includes lower arms 328 that extends across a bottom surface of the raceway 102. Inserts 330 may be carried by the lower arms 328 to engage rails defined at the bottom of the raceway 102. Knobs 332 allow a user to clamp the inserts 330 at the rails to secure the bracket 322 at the raceway 102 (e.g., see FIG. 29).

FIGS. 30-36 illustrate an eighth distribution module 340 suitable for use in the structured cabling system 100 and/or the fiber raceway arrangement 120 discussed above. The eighth distribution modules 340 includes a body 342 having an input 344 and an output 346. The body 342 carries one or more optical adapters 348 each having at least one internally accessible port and at least one externally accessible port. In certain examples, the input 344 includes the at least one internally accessible port and the output 346 includes the at least one externally accessible port of an optical adapter 348 (e.g., see FIG. 31). One or more first optical cables 110 are routed into the body 342 of the eighth distribution module 340 and plugged into the one or more internally accessible ports 344. One or more second optical cables 112 are routed to an exterior of the body 342 are plugged into the one or more externally accessible ports 346 to optically couple the second optical cables 112 to the first optical cables 110.

In certain implementations, the body 342 carries a plurality of optical adapters 348. In certain examples, each optical adapter 348 defines one or more internally accessible ports and one or more externally accessible ports. In some examples, each optical adapter 348 defines one or more internally accessible multi-fiber ports (e.g., configured to receive an MPO plug connector, an SN plug connector, etc.) and corresponding externally accessible multi-fiber ports. In other examples, each optical adapter 348 defines one or more internally accessible single-fiber ports (e.g., configured to receive an LC plug, a duplex LC plug, an SC plug, etc.). In the depicted example, the body 342 carries six SN adapters.

Figure 31:
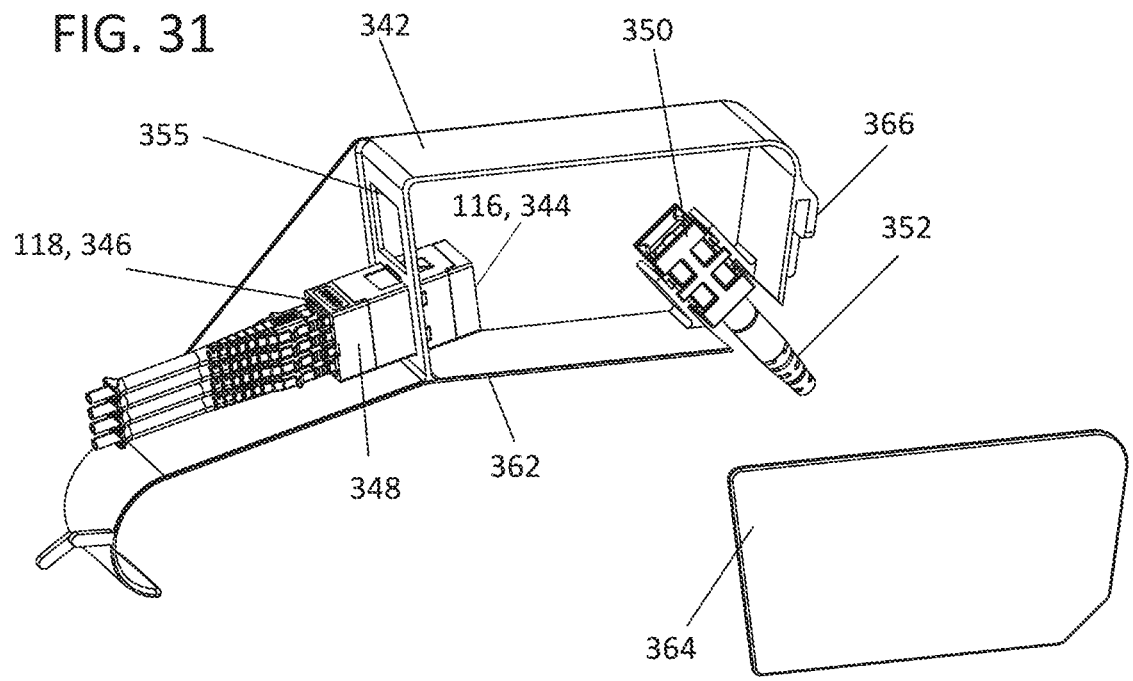
FIG. 31 shows a cover exploded from a remainder of the eighth distribution module of FIG. 30 for ease in viewing internal components.

As shown in FIG. 31, the first optical cable(s) 110 can be anchored to the housing 342 at an anchoring location. For example, a pigtail adapter 350 can be mounted to the housing 342 at the anchoring location. The pigtail adapter 350 and corresponding cable protection arrangement 352 may be the same as the pigtail adapter 310 and cable protection arrangement 312 described above with respect to the seventh distribution module 300.

In certain implementations, the body 342 is a multi-piece body. In the example depicted in FIG. 31, the body 342 includes a base 362 and a cover 364 that cooperate to define an interior in which the pigtail adapter 350 is mounted. Other configurations are possible.

In certain implementations, the body 342 includes an angled face 355 at which the optical adapters 348 are mounted. In the depicted example, the face 355 is angled partially downwardly towards the rack R to inhibit strain on the second optical cables 112 routed to the optical adapters 348. In certain implementations, a management structure extends outwardly from the angled face 355 of the body 342. The management structure inhibits excessive bending applied to the second optical cable(s) 112 routed to the externally accessible ports of the adapters 348.

In certain examples, the management structure includes a guide surface 354 that extends from the angled face 355 to a bend radius limiter 356 distal of the angled face 355. In certain examples, the guide surface 354 extends partially downwardly towards the rack R (e.g., perpendicular to the angled face 355) to further facilitate routing the second optical cables 112 towards the rack R. Retention fingers 358 may extend outwardly from the bend radius limiter 356 to facilitate holding the second optical cable(s) 112 to the management structure. A sidewall 360 also extends between the angled face 355 and the guide surface 354 to aid in retaining the second optical cable(s) 112 on the guide surface 354.

Figure 32:
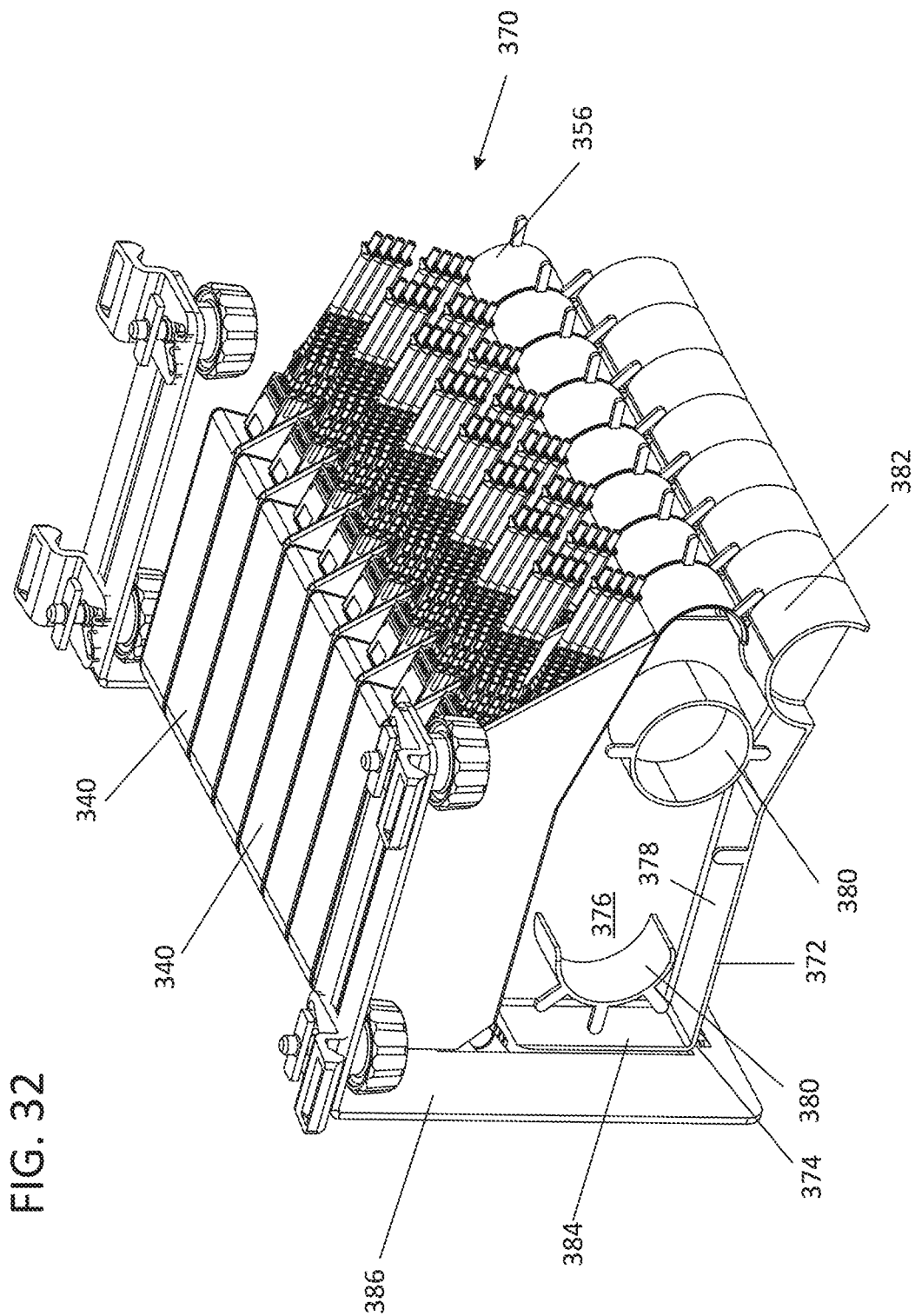
FIG. 32 is a front perspective view of an example distribution module arrangement implemented using multiple iterations of the eighth distribution module of FIG. 30, the distribution module arrangement also optionally including respective cable storage modules.

As shown in FIG. 32, one or more of the distribution modules 340 can be disposed together in a distribution module arrangement 370. For example, a plurality of the distribution modules 340 can be arranged in a row. In some examples, the distribution modules 340 are attached to the raceway 102 using a common bracket 386 (e.g., see FIGS. 33-36). In other examples, the distribution modules 340 are separately attached to the raceway 102. In some examples, each distribution module 340 receives a respective one of the first optical cables 110. In other examples, some fibers of a first optical cable 110 may be routed to one distribution module 340 while other fibers of the first optical cable 110 may be routed to another distribution module 340. In still other examples, one of the distribution modules 340 may receive multiple first optical cables 110.

Figure 33:
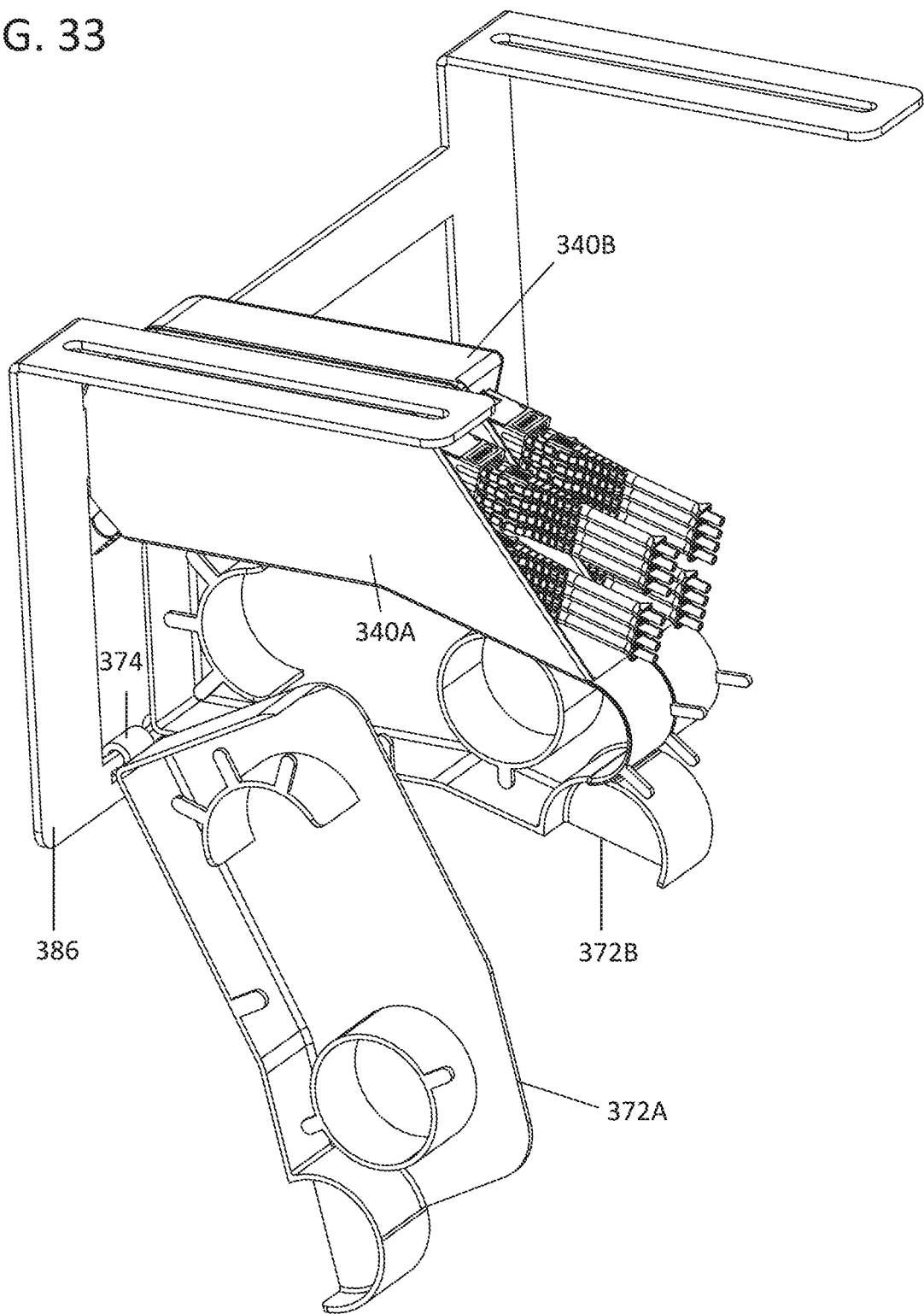
FIG. 33 illustrates one of the cable storage modules of FIG. 32 disposed in an access position and another of the cable storage modules disposed in a stowed position.
Figure 34:
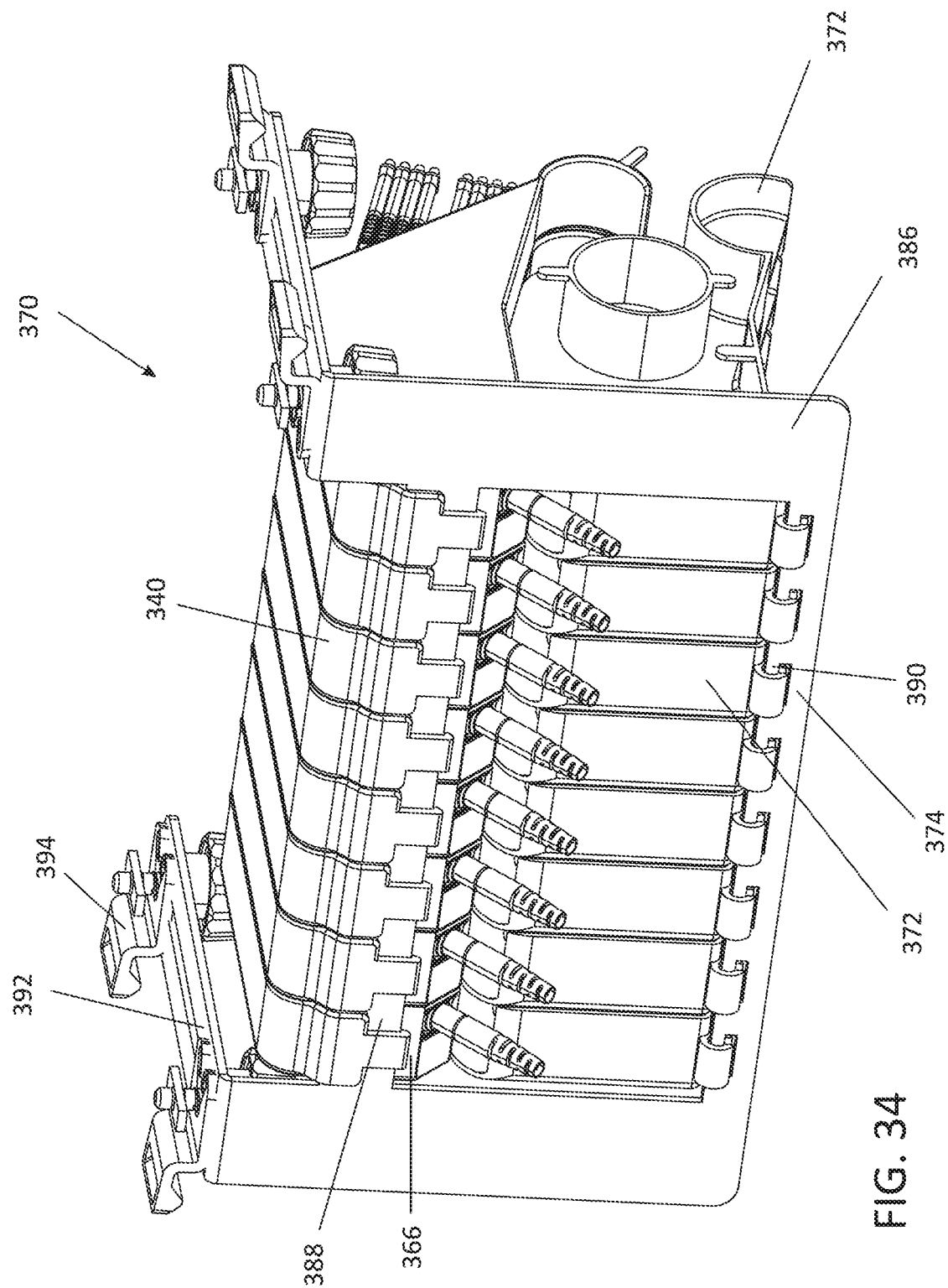
FIG. 34 is a rear perspective view of the distribution module arrangement of FIG. 32 shown mounted to an example bracket.

In certain implementations, the distribution module arrangement 370 also includes one or more storage modules 372 configured to hold excess length of second optical cables 112 routed to the distribution modules 340. For example, each distribution module 340 may have a corresponding storage module 372 mounted thereat. As shown in FIG. 33, the storage module 372 is rotatable about a pivot member 374 relative to the corresponding distribution module 340 between stowed and access positions. For example, in FIG. 33, a first storage module 372A is shown in the access position relative to the corresponding distribution module 340A while a second storage module 372B is shown in the stowed position relative to the corresponding distribution module 340B. In certain examples, the storage module 372 has an open top facing the corresponding distribution module 340 (e.g., see FIG. 33). Accordingly, rotating the storage module 372 to the access position does not pull on the cable routed therein.

As shown in FIG. 32, each storage module 372 includes a sidewall 376 from which a bottom wall 378 extends to define an interior of the module 372. The bottom wall 378 is sufficiently wide to accommodate and support the second optical cable(s) 112 routed to the corresponding distribution module 340. In certain examples, the storage module 372 has an open top facing the corresponding distribution module 340. Accordingly, rotating the storage module 372 to the access position does not pull on the cable routed therein. In certain examples, an end wall 384 extends outwardly from the sidewall 376 to protect the cables from the pivot member 374. The storage module 372 also includes one or more storage components (e.g., spools, bend radius limiters, etc.) extending outwardly from the sidewall 376. A final bend radius limiter 382 is disposed at an end of the bottom wall 378 to guide the cables out of the storage module 372.

In use, a second optical cable 112 received at a distribution module 340 is routed away from the adapter 348, over the guide surface 354, and over the bend radius limiter 356. The second optical cable 112 loops around the bend radius limiter 356 and enters the corresponding storage module 372 through the open top. The second optical cable 112 routes along a top of the storage module 372 towards the end wall 384. The second optical cable 112 is wrapped around a storage component 380 (e.g., a full or partial spool) adjacent the end wall 384, wound around and/or between the storage components 380 to take up excess length, and then routed along the bottom wall 378 to the final bend radius limiter 382 over which the second optical cable 112 hangs towards the server cabinet SE.

In certain implementations, corresponding distribution and storage modules 340, 372 are mounted to a common bracket 386. In certain examples, the distribution module 340 is not directly connected to the storage module 372, but rather is operatively coupled through the bracket 386. In certain examples, multiple sets of distribution and storage modules 340, 372 are mounted to the common bracket 386. The bracket 386 includes a frame 388 (e.g., a bar) to which the distribution module(s) 340 attach. For example, each distribution module 340 may include a hook 366 (FIG. 31) that mounts over the framework 388 to secure the distribution module 340 to the bracket 386. In certain examples, the bracket 386 also includes a pivot bar 390 about which the pivot member 374 extends. In other examples, the pivot member 374 otherwise couples to the bracket 386.

The bracket 386 can have a variety of forms depending on how the distribution and/or storage modules 340, 372 are to be coupled to the raceway 102. In the example shown in FIG. 34, the bracket 386 is configured to be coupled to a bottom of the raceway 102 so that the distribution modules 340 are disposed beneath the raceway 102. The bracket 386 includes upper arms 392 that extend outwardly from the frame 388 to support one or more insert members 394. In use, the upper arms 392 extend across the bottom of the raceway 102 and the insert members 394 engage rails or other securement structures at the bottom of the raceway 102.

Figure 35:
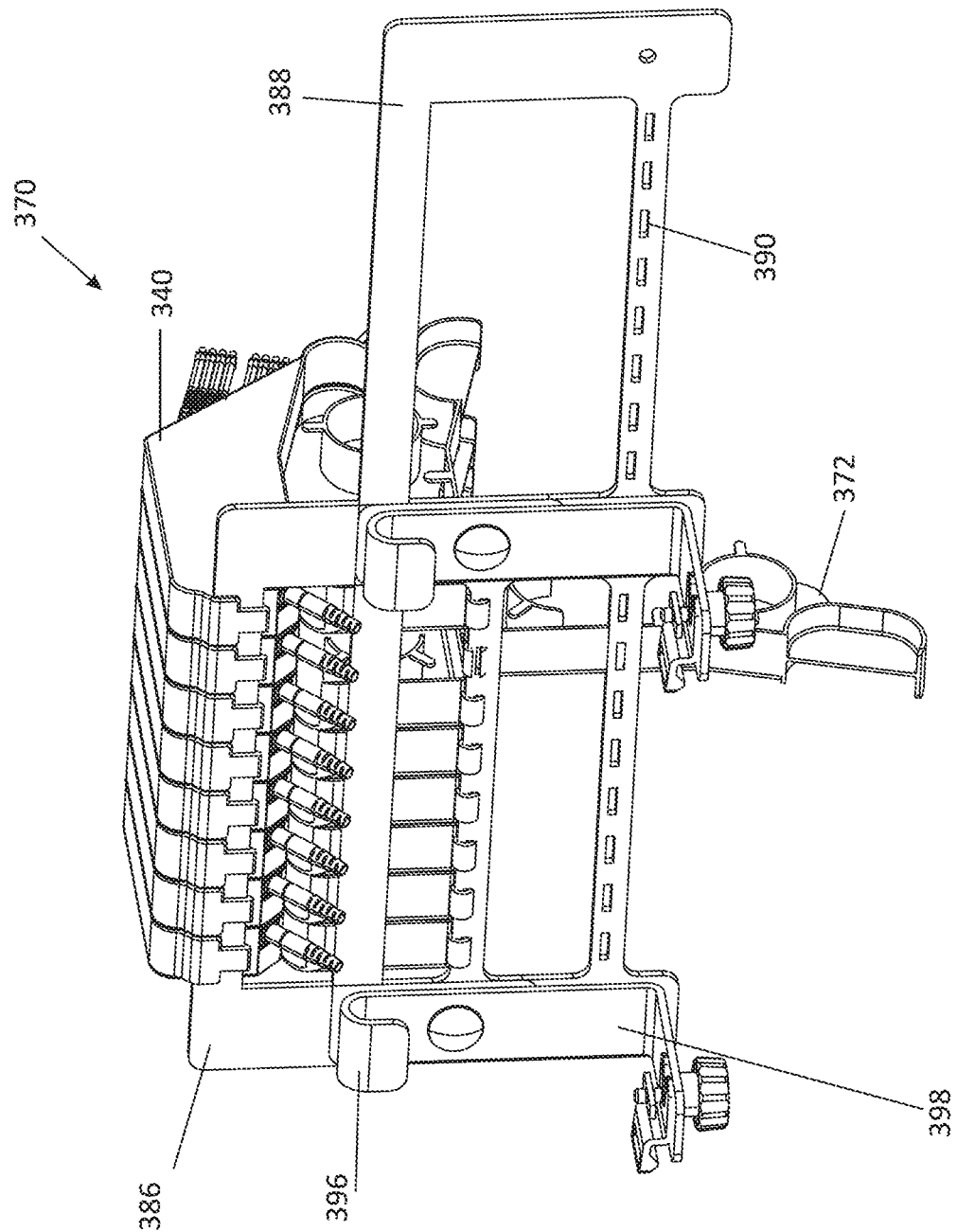
FIG. 35 is a rear perspective view of the distribution module arrangement of FIG. 32 shown mounted to another example bracket.
Figure 36:
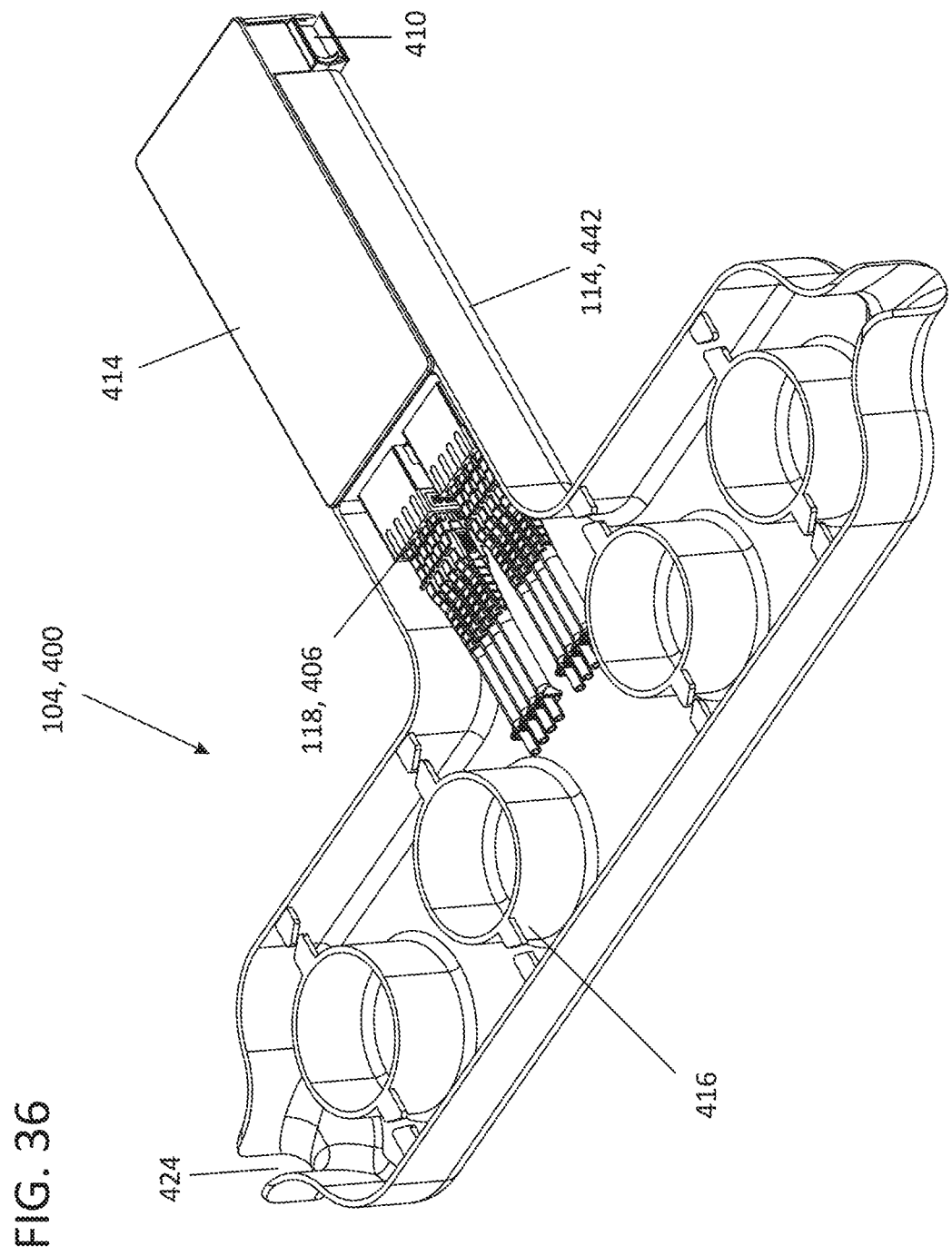
FIG. 36 is a front perspective view of a ninth example distribution module suitable for use in the cabling system of FIGS. 1-10.

In the example shown in FIG. 35, the bracket 386 is similar to the bracket 322 shown in FIGS. 28 and 29. The bracket 386 of FIG. 35 is configured to mount the distribution modules 340 to a side of the raceway 102. In FIG. 35, the bracket 386 includes hooks 396 that extend from the framework 388 in an opposite direction from the distribution modules 340. The hooks 396 are configured to hang over a top edge of a raceway 102 (e.g., see FIG. 29). In certain examples, the bracket 386 includes lower arms 398 that extends across a bottom surface of the raceway 102. Inserts may be carried by the lower arms 398 to engage rails defined at the bottom of the raceway 102. Knobs allow a user to clamp the inserts at the rails to secure the bracket 386 at the raceway 102.

In certain examples, the bracket 386 may provide for multiple configurations of the distribution modules 340 and storage modules 372. For example, the bracket 386 may include first and second sections that allow the distribution and storage modules 340, 372 to be mounted at higher and lower positions, respectively, relative to a remainder of the bracket 386. For example, the bracket 386 of FIG. 35 has a first section (left part of image) with a higher frame 388 compared to a second section (right part of image).

FIGS. 36-40 illustrate a ninth example distribution module 400 suitable for use in the structured cabling system 100 and/or the fiber raceway arrangement 120 discussed above. The ninth distribution modules 400 includes a body 402 having an input 404 and an output 406. The body 402 carries one or more optical adapters 408 each having at least one internally accessible port and at least one externally accessible port. In certain examples, the input 404 includes the at least one internally accessible port and the output 406 includes the at least one externally accessible port of an optical adapter 408 (e.g., see FIG. 37).

In some examples, each optical adapter 408 defines one or more internally accessible multi-fiber ports (e.g., configured to receive an MPO plug connector, an SN plug connector, etc.) and corresponding externally accessible multi-fiber ports. In other examples, each optical adapter 408 defines one or more internally accessible single-fiber ports (e.g., configured to receive an LC plug, a duplex LC plug, an SC plug, etc.). In the depicted example, the body 402 carries two SN adapters, which each receive four plugs carrying two optical fibers.

In certain implementations, the ninth distribution module 400 includes an enclosed body portion 414 and an open management section 416. The optical adapters 408 are disposed so that the internally accessible ports are disposed within the enclosed body portion 414 and the externally accessible ports are disposed at the management section 416. One or more first optical cables 110 are routed into the enclosed body portion 414 of the ninth distribution module 400 and plugged into the one or more internally accessible ports 404. One or more second optical cables 112 are routed to the management section 416 of the body 402 and are plugged into the one or more externally accessible ports 406 to optically couple the second optical cables 112 to the first optical cables 110.

Figure 37:
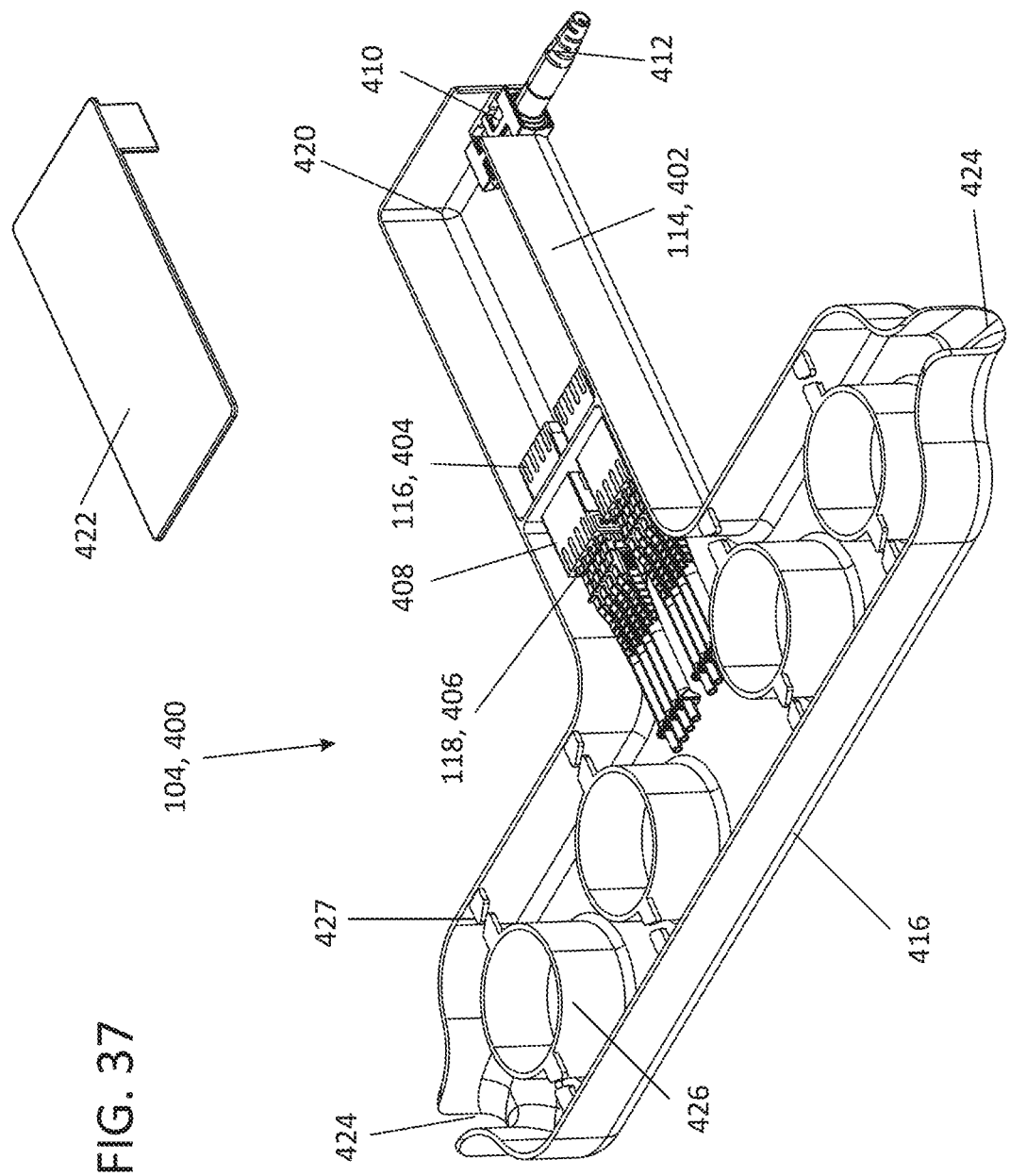
FIG. 37 shows a cover exploded from a remainder of the ninth distribution module of FIG. 36 for ease in viewing internal components.

As shown in FIG. 37, the first optical cable(s) 110 can be anchored to the body 402 at an anchoring location. For example, a pigtail adapter 410 can be mounted to the body 402 at the anchoring location. The pigtail adapter 410 and corresponding cable protection arrangement 412 may be the same as the pigtail adapter 310 and cable protection arrangement 312 described above with respect to the seventh distribution module 300.

As also shown in FIG. 37, the body 402 may include a base 420 and a cover 422 that cooperate to define the enclosed body portion 414. In some examples, the base 420 also defines the management section 416. In other examples, the management section 416 may be a separate piece that attaches to the base 420.

In certain implementations, the management section 416 includes a plurality of cable management components 426 (e.g., full spools, partial spools, bend radius limiters, retention fingers, etc.) about which excess length of the second optical cables 112 can be stored. The management section 416 defines one or more cable entrance/exits 424 through which the second optical cables 112 extend. In some implementations, the management section 416 includes a cable entrance/exits 424 at each of opposite ends of the management section 416 (e.g., see FIG. 37). Such a configuration allows the user freedom to select to which side the second cables 112 should be routed to best reach the respective server cabinet SE. Alternatively, the user may choose to route some of the cables 112 to each side to route the cables to opposite sides of the cabinet SE or to adjacent cabinets SE. In other implementations, the management section 416 may define a single cable entrance/exit 424. In the distribution module 400 depicted in FIG. 39, the cable entrance/exit 424 aligns with the adapters 408.

Figure 38:
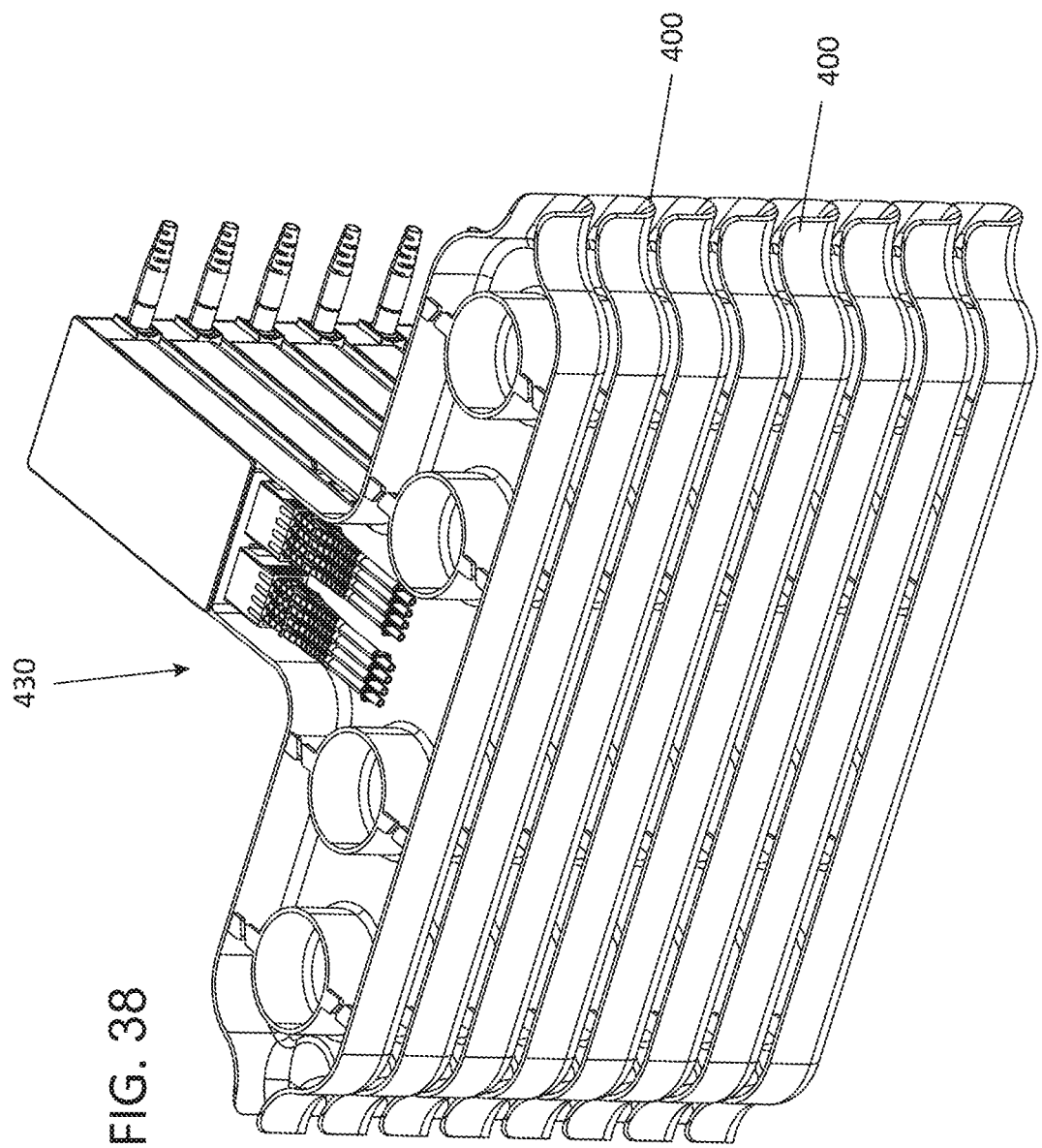
FIG. 38 is a front perspective view of an example distribution module arrangement implemented using multiple iterations of the ninth distribution module of FIG. 36.
Figure 39:
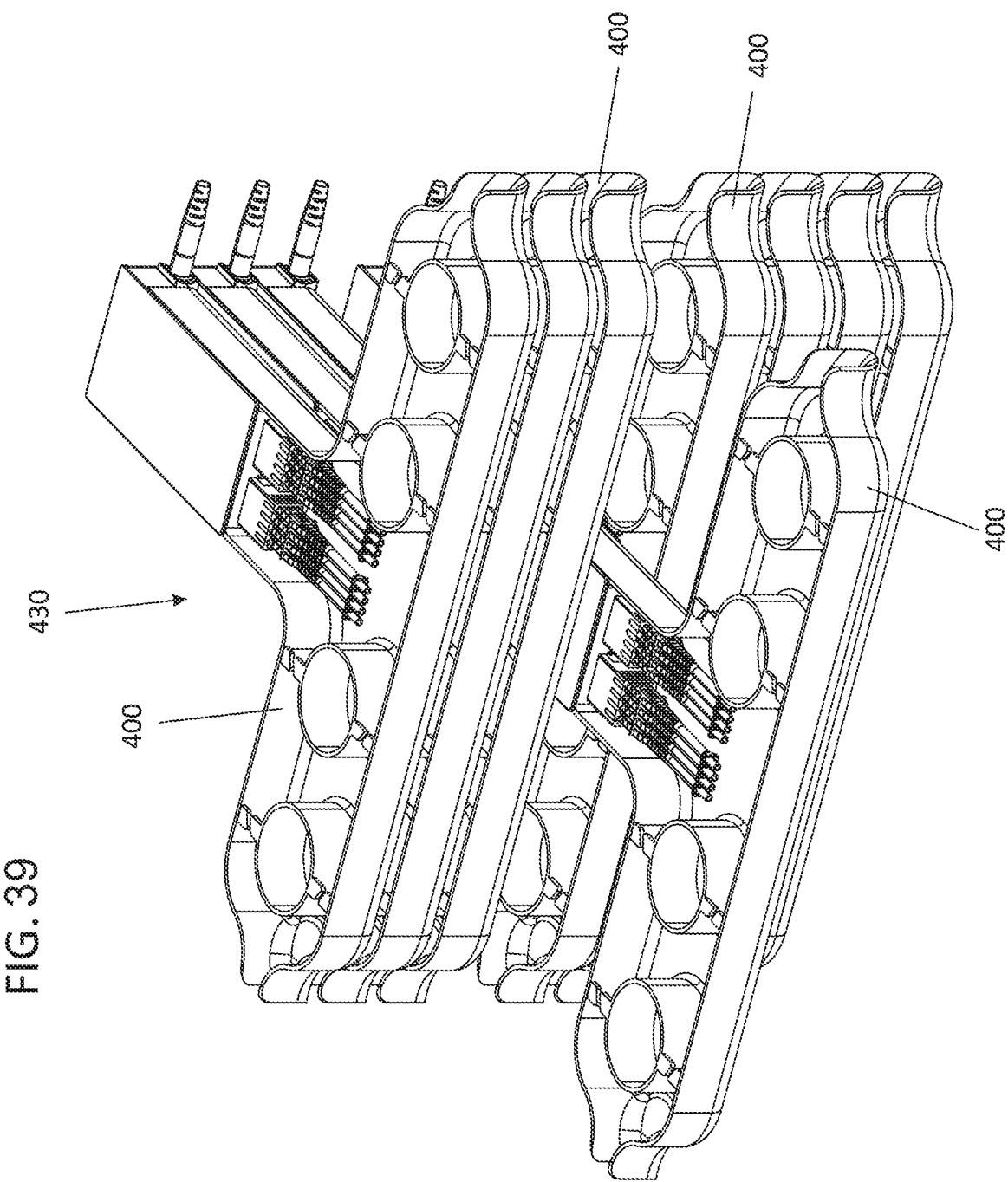
FIG. 39 shows one of the distribution modules of the distribution module arrangement of FIG. 38 disposed in an access position while the remainder of the distribution modules are disposed in stowed positions.
Figure 40:
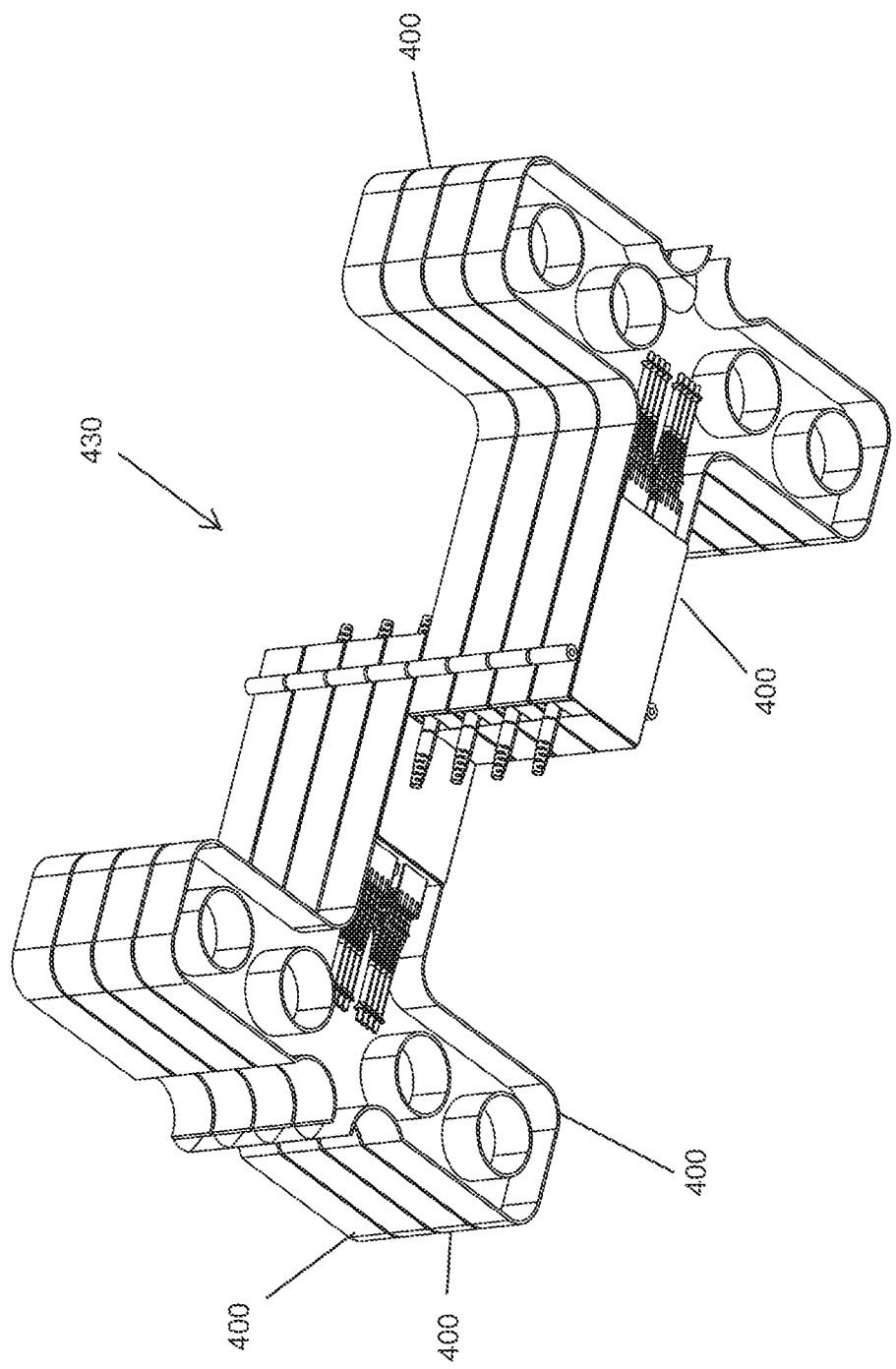
FIG. 40 is a bottom perspective view of another example distribution module arrangement implemented using multiple iterations of the ninth distribution module of FIG. 36 in an upside-down orientation.

As shown in FIGS. 38 and 39, one or more of the distribution modules 400 can be disposed together in a distribution module arrangement 430. For example, a plurality of the distribution modules 400 can be arranged in a vertical stack. In some examples, the distribution modules 400 are attached to the raceway 102 using a common bracket (e.g., any of the mounting brackets disclosed herein). In other examples, the distribution modules 400 are separately attached to the raceway 102. In some examples, each distribution module 400 receives a respective one of the first optical cables 110. In other examples, some fibers of a first optical cable 110 may be routed to one distribution module 400 while other fibers of the first optical cable 110 may be routed to another distribution module 400. In still other examples, one of the distribution modules 400 may receive multiple first optical cables 110.

In certain implementations, each of the distribution modules 400 of the distribution module arrangement 430 is separately movable between a stowed position and an access position. When the distribution modules 400 are in the stowed position, the distribution modules 400 are aligned in the stack. Moving one of the distribution modules 400 to the access position provides access to the management section 416 and/or to the externally accessible ports of the adapters 408 of the distribution module 400. In some examples, the distribution modules 400 pivot between the stowed and access positions. In other examples, the distribution modules 400 slide between the stowed and access positions (e.g., see FIG. 39).

In some implementations, one or more of the distribution modules 400 may be disposed in a first orientation in which the management components 426 face away from the rack R. Accordingly, gravity will hold the second optical cables 112 in the management section 416 of the distribution module 400. In other implementations, the distribution module(s) 400 may be disposed in a second orientation in which the management components 426 face towards the rack R. One or more of the management components 426 may include retention arms 427 that aid in holding the second optical cables 112 at the management section 416. Positioning the distribution module 400 in the second orientation may facilitate access (e.g., non-ladder) to the modules when mounted to an overhead trough.

FIGS. 41-44 illustrate a tenth distribution module 450 suitable for use in the structured cabling system 100 and/or the fiber raceway arrangement 120 discussed above. The tenth distribution modules 450 includes a body 452 having an input 454 and an output 456. The body 452 carries one or more optical adapters 458 each having at least one internally accessible port and at least one externally accessible port. In certain examples, the input 454 includes the at least one internally accessible port and the output 456 includes the at least one externally accessible port of an optical adapter 458 (e.g., see FIG. 41).

In some examples, each optical adapter 458 defines one or more internally accessible multi-fiber ports (e.g., configured to receive an MPO plug connector, an SN plug connector, etc.) and corresponding externally accessible multi-fiber ports. In other examples, each optical adapter 458 defines one or more internally accessible single-fiber ports (e.g., configured to receive an LC plug, a duplex LC plug, an SC plug, etc.). In the depicted example, the body 452 carries eight duplex LC adapters.

In certain implementations, the tenth distribution module 450 includes an enclosed body portion 464 and an open management section 466. The optical adapters 458 are disposed so that the internally accessible ports are disposed within the enclosed body portion 464 and the externally accessible ports are disposed at the management section 466. One or more first optical cables 110 are routed into the enclosed body portion 464 of the tenth distribution module 450 and plugged into the one or more internally accessible ports 454. One or more second optical cables 112 are routed to the management section 466 of the body 452 and are plugged into the one or more externally accessible ports 456 to optically couple the second optical cables 112 to the first optical cables 110.

In some implementations, the first optical cable(s) 110 can be pre-cabled to the tenth distribution module 450 prior to installation of the tenth distribution module 450 at the raceway 102. In other implementations, the first optical cable(s) 110 can be routed to the tenth distribution module 450 and into the enclosed body portion 464 during installation. In some implementations, the body 452 defines a cable guide 468 that extends outwardly from the body 452. The cable guide defines a passageway leading from an exterior of the body 452 to an interior of the enclosed body portion 464. One or more of the first optical cables 110 extend into the enclosed body portion 464 through the passageway and then plug into the internally accessible ports of the adapters 458. In certain implementations, the input passage 468 includes a cable guide 468 extending outwardly from the body 452. In the example shown, the cable guide 468 is curved. In other implementations, the first optical cable(s) 110 can be anchored to the body 402 at an anchoring location within the enclosed body potion 464. For example, a pigtail adapter can be mounted to the body 452 at the anchoring location. The pigtail adapter and corresponding cable protection arrangement may be the same as the pigtail adapter 310 and cable protection arrangement 312 described above with respect to the seventh distribution module 300.

Figure 41:
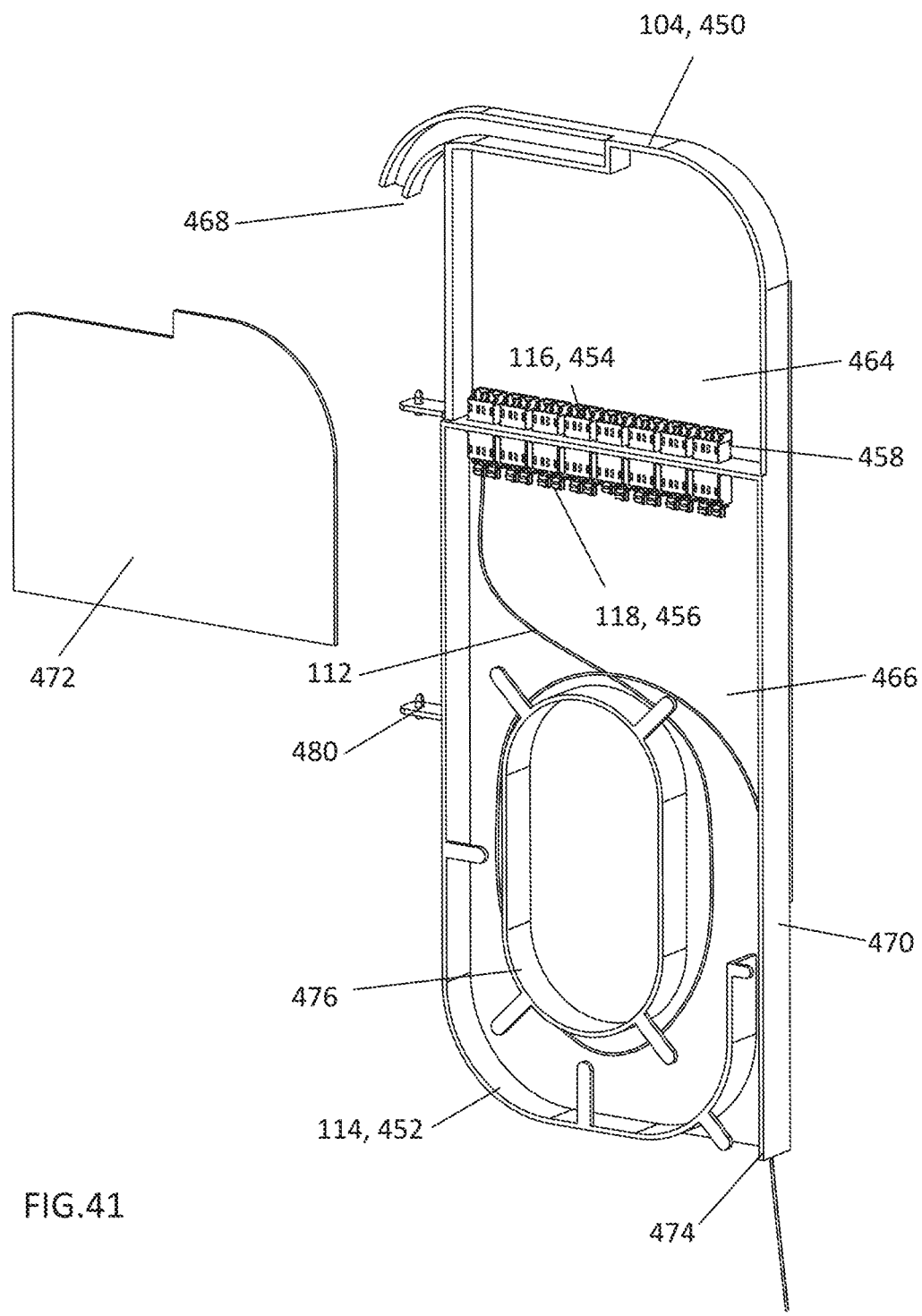
FIG. 41 is a front perspective view of a tenth example distribution module suitable for use in the cabling system of FIGS. 1-10, a cover of the tenth distribution module being exploded from a remainder of the distribution module for ease in viewing internal components.
Figure 42:
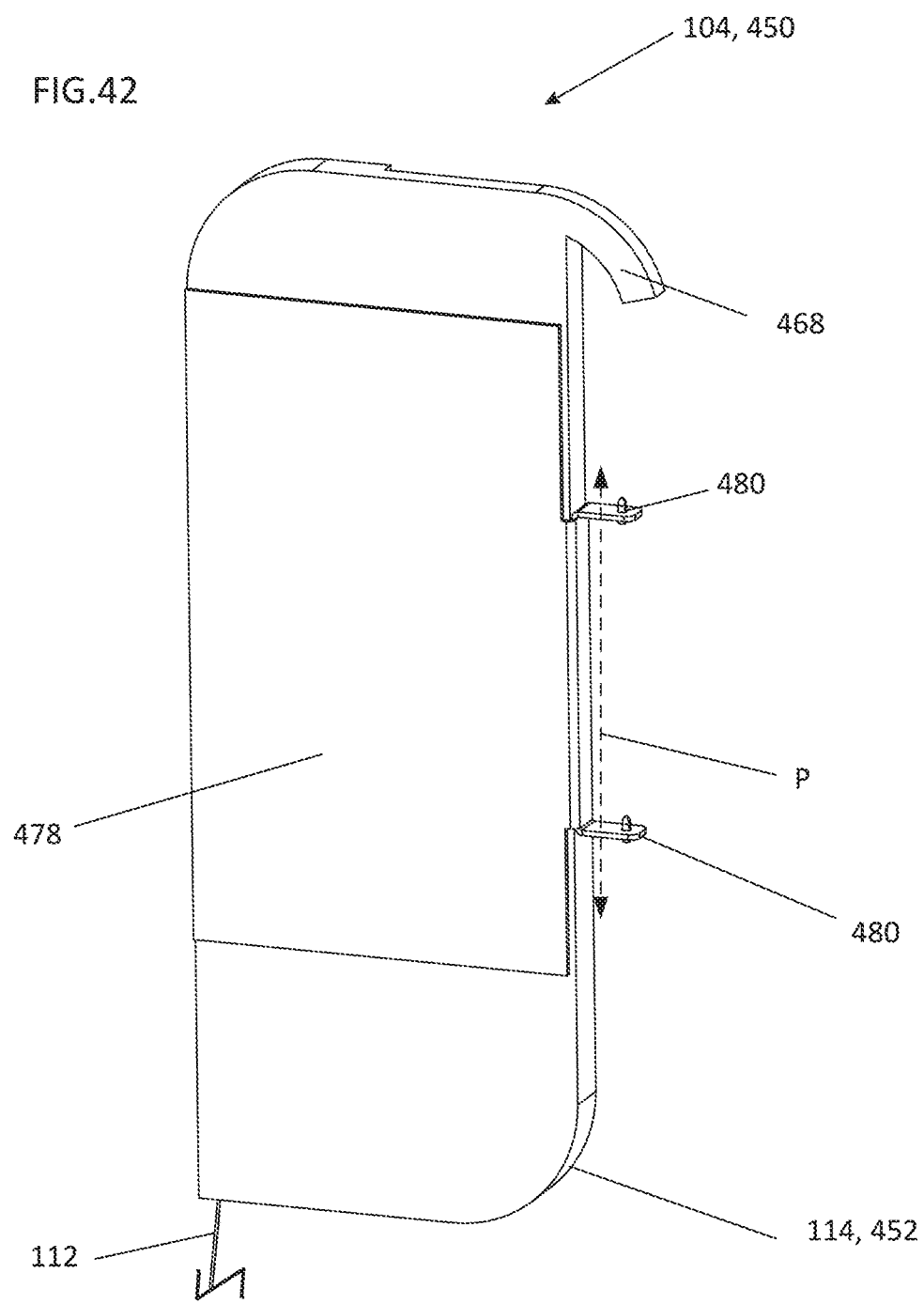
FIG. 42 is a rear perspective view of the tenth distribution module of FIG. 41.

As also shown in FIG. 41, the body 452 may include a base 470 and a cover 472 that cooperate to define the enclosed body portion 464. In some examples, the base 470 also defines the management section 466. In other examples, the management section 466 may be a separate piece that attaches to the base 470. In certain examples, the body 452 is elongate between the cable guide 468 and a cable entrance/exit 474 through which the second optical cable(s) 112 extend. In certain examples, the body 452 is elongate along an axis that is parallel with insertion axes of the ports of the adapters 458.

In certain implementations, the management section 466 includes one or more cable management components 476 (e.g., full spools, partial spools, bend radius limiters, retention fingers, etc.) about which excess length of the second optical cables 112 can be stored. The management section 466 defines one or more cable entrance/exits 474 through which the second optical cables 112 extend. In some implementations, the management section 416 includes a cable entrance/exits 474 at a side of the body 452 facing the rack R.

In certain implementations, the distribution module 450 is configured to pivotally mount to the raceway 102. For example, the distribution module 450 may include a pivot bracket 478 attached to the body 452 (e.g., see FIG. 42). The pivot bracket 478 is configured to pivotally couple to a raceway mounting bracket 492. For example, the pivot bracket 478 may include a hinge part 480 (e.g., a hinge pin receptacle) that defines a pivot axis P about which the distribution module 450 pivots. In other examples, the body 452 may define the hinge part 480.

Figure 43:
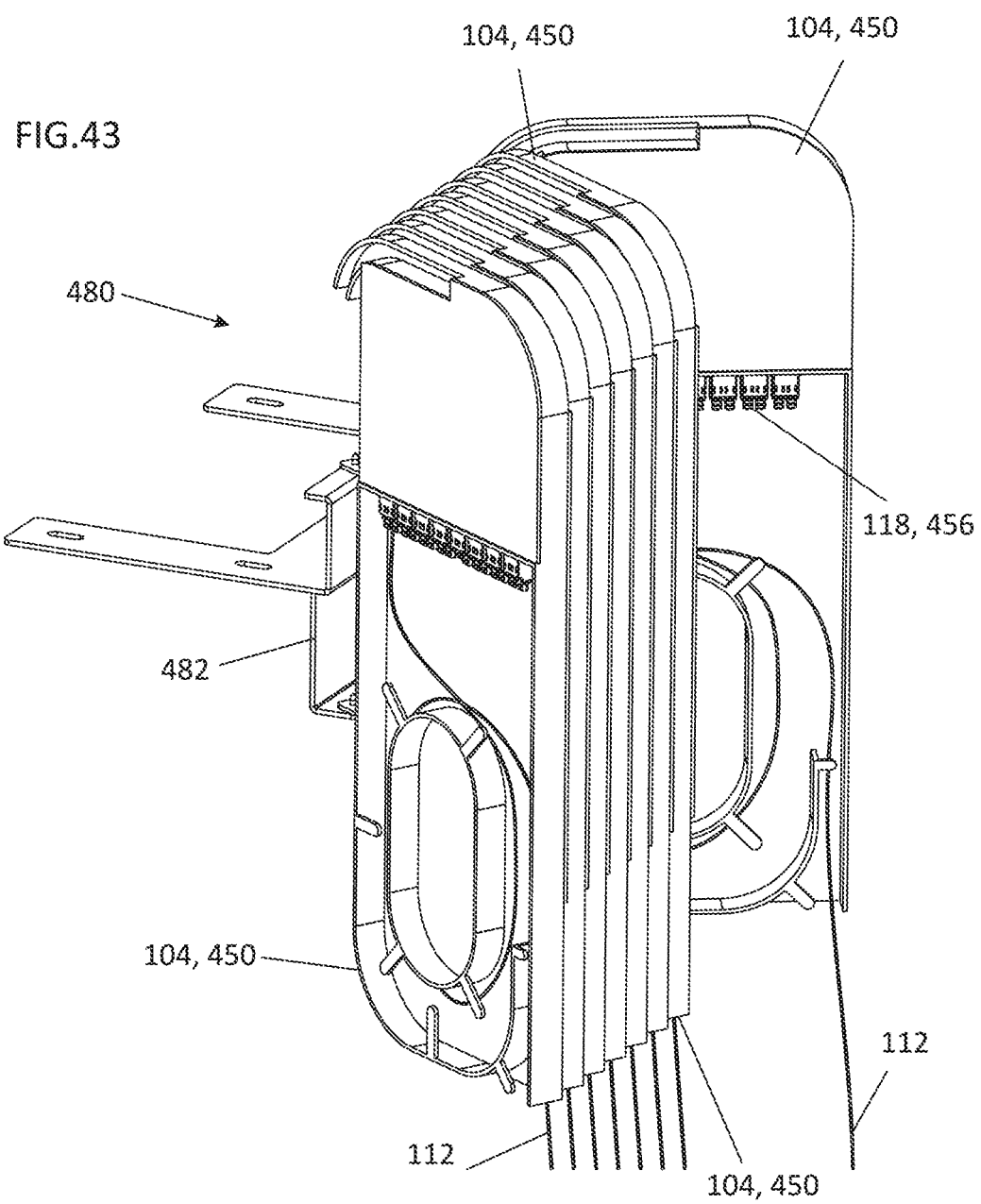
FIG. 43 is a front perspective view of an example distribution module arrangement implemented using multiple iterations of the tenth distribution module of FIG. 41 mounted to a common bracket.
Figure 44:
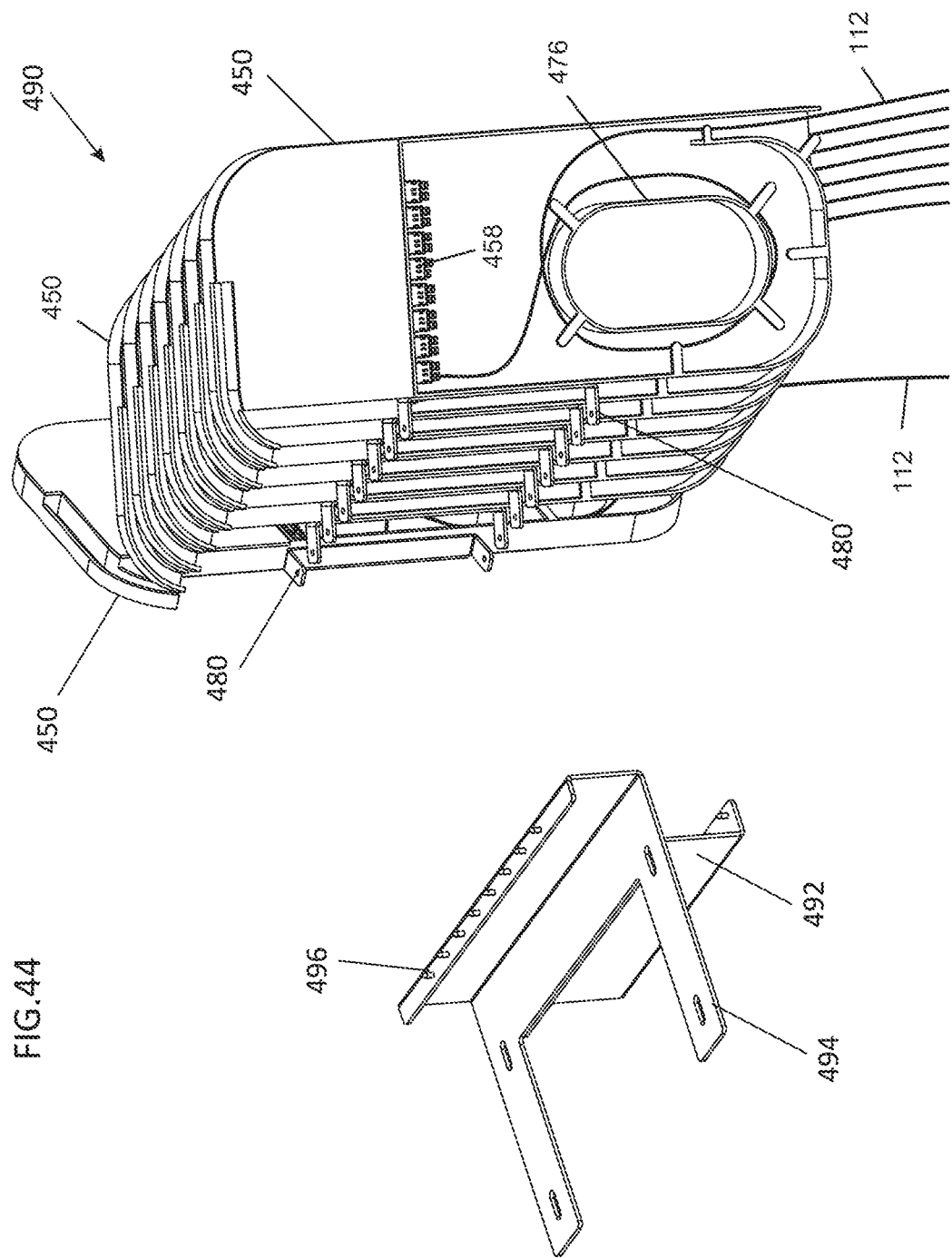
FIG. 44 shows the distribution module arrangement of FIG. 43 exploded away from an example bracket for ease in viewing.

As shown in FIGS. 43 and 44, one or more of the distribution modules 450 can be disposed together in a distribution module arrangement 490. For example, a plurality of the distribution modules 450 can be arranged in a horizontal row. In some examples, the distribution modules 450 are attached to the raceway 102 (e.g., pivotally attach) using a common bracket 492. In other examples, the distribution modules 450 are separately attached to the raceway 102. In some examples, each distribution module 450 receives a respective one of the first optical cables 110. In other examples, some fibers of a first optical cable 110 may be routed to one distribution module 450 while other fibers of the first optical cable 110 may be routed to another distribution module 450. In still other examples, one of the distribution modules 450 may receive multiple first optical cables 110.

In certain implementations, the distribution modules 450 of the distribution module arrangement 490 are pivotally coupled to the raceway 102. In certain examples, the distribution modules 450 are separately pivotal relative to the raceway 102. In certain examples, the distribution modules 450 pivot about separate, parallel pivot axes. Accordingly, a user can access the adapters 458 and/or management section 466 of any of the distribution modules 450 without removing any of the distribution modules 450 from the raceway 102 even when the distribution modules 450 are mounted close together (e.g., see FIGS. 43 and 44).

An example raceway mounting bracket 492 is shown in FIG. 44. The raceway mounting bracket 492 includes a first section 494 at which the bracket 492 mounts to the raceway 102 and a second section 496 at which the distribution modules 450 mount to the bracket 492. In the depicted example, the first section 494 may include arms that engage rails or other structure on the raceway 102 or that carry inserts that engage the rails. In another example, the first section 494 may include hooks that mount over a top edge of the raceway 102. The second section 496 engages the respective pivot bracket 478 of the one or more distribution modules 450. In the depicted example, the second section 496 includes two platforms to which the hinge parts 480 of the pivot bracket(s) 478 mount.

It will be understood that each of the above described distribution modules 140, 170, 200, 230, 250, 270, 300, 340, 400, and 450 forms another example aspect of the disclosure. For example, each of the distribution modules 140, 170, 200, 230, 250, 270, 300, 340, 400, and 450 can be used separate from the structured cabling system and/or raceway systems described herein. In certain examples, one or more of the distribution modules 140, 170, 200, 230, 250, 270, 300, 340, 400, and 450 can be subsequently added to a structured cabling system, raceway system, or other fiber installation to facilitate fiber connection and/or management.

Having described the preferred aspects and implementations of the present disclosure, modifications and equivalents of the disclosed concepts may readily occur to one skilled in the art. However, it is intended that such modifications and equivalents be included within the scope of the claims which are appended hereto.

What is claimed is:

1. A communications system comprising:
   a rack;
   a switch cabinet mounted to the rack;
   a plurality of server cabinets mounted to the rack;
   a fiber raceway installed over the rack;
   a plurality of distribution modules mounted along the fiber raceway, each distribution module being positioned over a respective one of the server cabinets;
   a plurality of first cables routed directly from switches in the switch cabinet to the distribution modules; and
   a plurality of second cables routed directly from the distribution modules down to servers in the respective server cabinets.

2. The communications system of claim 1, wherein one of the first cables connects to a first of the distribution modules at an externally accessible port carried by the first distribution module.

3. The communications system of claim 2, wherein one of the second cables connects to the first distribution module at another externally accessible port carried by the first distribution module, wherein the first distribution module carries an optical circuit that connects the externally accessible port and the another externally accessible port.

4. The communications system of claim 3, wherein the another externally accessible port faces laterally outwardly from the first distribution module, and wherein the first distribution module also includes a bend radius limiter to guide the one of the second cables from the another externally accessible port.

5. The communications system of claim 3, wherein the another externally accessible port faces downwardly towards the respective server cabinet.

6. The communications system of claim 2, wherein the distribution module includes a plurality of spools that are rotatable relative to the fiber raceway, wherein respective ones of the second cables are paid out from the spools, wherein the respective ones of the second cables are optically coupled to the externally accessible port.

7. The communications system of claim 6, wherein the at least one spool carries the externally accessible port.

8. The communications system of claim 6, wherein the externally accessible port is carried by a housing that also holds the at least one spool, the first distribution module also carrying an optical circuit to optically couple the externally accessible port to the respective second cables.

9. The communications system of claim 1, wherein one of the first cables connects to a first of the distribution modules at an internally accessible port within the first distribution module.

10. The communications system of claim 9, wherein the first distribution module includes a spool from which the one of the first cables is paid out, the internally accessible port being defined by an optical adapter carried by the spool, the optical adapter also defining an externally accessible port, wherein one of the second cables connects to the externally accessible port.

11. The communications system of claim 10, wherein the spool is one of a plurality of spools, each of the spools being configured to pay out a respective one of the first cables, and each of the spools carrying an externally accessible port to which a respective one of the second cables connects.

12. The communications system of claim 10, wherein the spool holds and pays out multiples ones of the first cables; and wherein the internally accessible port is one of a plurality of internally accessible ports that each receive one of the first cables held by the spool.

13. The communications system of claim 9, wherein the first distribution module includes a plurality of distribution modules including a first distribution module, each distribution module carrying an optical adapter, the optical adapter of the first distribution module defining the internally accessible port.

14. The communications system of claim 13, wherein the one of the first cables extends through a pigtail adapter carried by the first distribution module.

15. The communications system of claim 13, wherein the optical adapter of the first distribution module defines another internally accessible port to which one of the second cables connects, the another internally accessible port being is accessible within an interior of the first distribution module, and wherein the distribution modules are pivotally coupled to the fiber raceway so that the distribution modules are pivotable away from each other.

16. The communications system of claim 15, wherein the first distribution module is oriented so that the internally accessible port and the another internally accessible port define vertical fiber insertion axes extending between the fiber raceway and the respective server cabinet.

17. The communications system of claim 15, wherein the first distribution module is oriented so that the internally accessible port and the another internally accessible port define horizontal fiber insertion axes.

18. The communications system of claim 13, wherein the optical adapter of the first distribution module defines an externally accessible port to which one of the second cables connects.

19. The communications system of claim 18, wherein the first distribution module includes a storage module mounted at the first distribution module, the storage module being pivotal relative to the first distribution module.

20. The communications system of claim 1, wherein the first distribution module includes a first spool and a second spool, the first spool holding and paying out one of the first cables, the second spool holding and paying out one of the second cables, the one of the first cable and the one of the second cable having connectorized ends that mate together at an optical adapter.

21. The communications system of claim 1, wherein the fiber raceway includes at least one raceway unit, the raceway unit including a plurality of troughs that are configured to couple together end-to-end, wherein the first cables extend from respective ones of the distribution modules, along the troughs of the raceway unit towards free ends at a first axial end of the raceway unit, wherein the first cables tether the troughs together even when the troughs are not coupled together end-to-end.

22. The communications system of claim 1, wherein the plurality of server cabinets includes a first set of server cabinets mounted to one side of the switch cabinet and a second set of server cabinets mounted to other side of the switch cabinet; and wherein a first group of the first cables is routed to the first set of server cabinets and a second group of the first cables is routed to the second set of the server cabinets.

23. The communications system of claim 1, wherein the fiber raceway includes a storage spool at the first distribution module.

24. The communications system of claim 1, wherein the fiber raceway is an auxiliary fiber raceway mounted below an existing fiber raceway.

25. A fiber raceway arrangement comprising:
a plurality of fiber raceway troughs, each trough being elongate between opposite ends, the troughs being configured to couple together end-to-end to define a channel extending between opposite first and second axial ends;
a plurality of distribution modules mounted to the troughs at locations spaced along the channel, each of the distribution modules having a first connection interface and a second connection interface; and
a bundle of optical cables pre-installed along the fiber raceway troughs to form a raceway unit, the optical cables tethering the troughs of the raceway unit together even when the troughs are not coupled to each other, each of the optical cables of the bundle extending between opposite first and second ends, the first ends of the optical cables being free and being connectorized, and the second ends of the optical cables being optically coupled to respective ones of the distribution modules;
the distribution modules optically coupling the second ends of the optical cables to the second connection interfaces.

26. The fiber raceway arrangement of claim 25, wherein each of the distribution modules includes a body carrying a first externally accessible port and a plurality of second externally accessible ports, the first externally accessible port defining the first connection interface of the respective distribution module, each distribution module also including an optical circuit that optically couples the respective first externally accessible port with the respective second externally accessible ports.

27. The fiber raceway arrangement of claim 26, wherein the first externally accessible port is one of a plurality of first externally accessible ports, the first externally accessible ports being configured to receive second ends of one or more optical cables.

28. The fiber raceway arrangement of claim 26, wherein the first externally accessible port is a multi-fiber port; and wherein each of the second externally accessible ports is a single-fiber port.

29. The fiber raceway arrangement of claim 25, wherein each of the distribution modules includes at least one spool that is rotatable relative to the respective trough.

30. The fiber raceway arrangement of claim 29, wherein the at least one spool of each distribution module stores excess length of a respective one of the optical cables of the bundle, the optical cables having connectorized ends that define the first connection interfaces of the distribution modules.

31. The fiber raceway arrangement of claim 29, wherein the at least one spool of each distribution module stores excess length of a second optical cable having a connectorized end that defines the second connection interface of the respective distribution module.

32. The fiber raceway arrangement of claim 25, wherein the first connection interface of each distribution module is one of a plurality of first connection interfaces and wherein the second connection interface of each distribution module is one of a plurality of second connection interfaces.

33. The fiber raceway arrangement of claim 32, wherein each of the distribution modules includes a plurality of distribution modules, each distribution module having at least one of the first connection interfaces and at least one of the second connection interfaces of the respective distribution module.

34. The fiber raceway arrangement of claim 33, wherein the at least one of the second connection interfaces of each distribution module is externally accessible.

35. The fiber raceway arrangement of claim 25, wherein each trough defines a plurality of apertures through the trough to provide a path between an interior of the trough and an exterior of the trough, and wherein each of the distribution modules is disposed at a respective one of the apertures.

36. The fiber raceway arrangement of claim 25, further comprising a plurality of joining members that couple the troughs together end-to-end.

37. The fiber raceway arrangement of claim 25, wherein the troughs directly mate together end-to-end.

38. A method of installing a cabling system at a rack comprising:
routing a plurality of first cables along a raceway between a switch cabinet and a plurality of distribution modules disposed at spaced locations along the raceway so that the first cables extend directly between the switch cabinet and the distribution modules; and
routing a plurality of second cables directly between the distribution modules and respective server cabinets.

* * * * *